(12) United States Patent
Irie et al.

(10) Patent No.: US 6,813,159 B2
(45) Date of Patent: Nov. 2, 2004

(54) DISPLAY DEVICE EQUIPPED WITH PLASMA DISPLAY PANEL

(75) Inventors: Shoichi Irie, Toyonaka (JP); Kazunobu Kojima, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 67 days.

(21) Appl. No.: 10/386,429

(22) Filed: Mar. 13, 2003

(65) Prior Publication Data

US 2003/0169573 A1 Sep. 11, 2003

Related U.S. Application Data

(62) Division of application No. 09/830,651, filed as application No. PCT/JP99/05998 on Oct. 29, 1999, now Pat. No. 6,560,124.

(30) Foreign Application Priority Data

Oct. 30, 1998 (JP) .............................................. 10-326042

(51) Int. Cl.$^7$ ............................. H05K 7/02; H01J 29/02
(52) U.S. Cl. ....................... 361/752; 361/681; 248/917; 313/461
(58) Field of Search ................................ 361/679, 681, 361/682, 752, 753, 800, 801, 816, 818; 174/35 R, 35 MS, 35 GC; 248/917; 313/461

(56) References Cited

U.S. PATENT DOCUMENTS 6,229,085 B1 * 5/2001 Gotoh et al. ........... 174/35 MS
6,310,767 B1 * 10/2001 Spear et al. ................. 361/681
6,560,124 B1 * 5/2003 Irie et al. ..................... 361/816

FOREIGN PATENT DOCUMENTS

| JP | 9-172267 | 6/1997 |
| JP | 62-137479 | 8/1997 |
| JP | 10-143092 | 5/1998 |
| JP | 10-282895 | 10/1998 |

* cited by examiner

*Primary Examiner*—Randy W. Gibson
*Assistant Examiner*—Dameon E. Levi
(74) *Attorney, Agent, or Firm*—Wenderoth, Lind & Ponack, L.L.P.

(57) ABSTRACT

In a display device, attached to a plate-type chassis (2) is a PDP (1) having a display screen on which videos are displayed and a circuit board (9) on which a circuit driving the PDP (1) is arranged. The circuit board (9) is shielded with respect to the PDP (1) thanks to the chassis (2), and thus does not receive any unwanted radiation noise radiated by the PDP (1). The display device further includes a back cover (6) and a cabinet (7) each having conductivity. The back cover (6) and the cabinet (7) house therein the PDP (1) and the circuit board (9) attached to the chassis (2). The back cover (6) and the cabinet (7) are both electrically insulated from the chassis (2). Therefore, any unwanted radiation noise from the PDP (1) and the circuit on the circuit board (9) is stopped leaking to the outside.

1 Claim, 25 Drawing Sheets

DISPLAY DEVICE EQUIPPED WITH PLASMA DISPLAY PANEL

This application is a divisional application of application Ser. No. 09/830,651 filed Apr. 30, 2001, now U.S. Pat. No. 6,560,124, which is the National Stage of International Application No. PCT/JP99/05998, filed Oct. 29, 1999.

TECHNICAL FIELD

The present invention relates to display devices equipped with plasma display panels and, more specifically, to a display device preventing any unwanted radiation noise from leaking to the outside.

BACKGROUND ART

Generally, such display device comes together with a circuit board on which a circuit driving the plasma display panel (hereinafter, referred to simply as PDP (Plasma Display Panel)) is arranged. The problem here is, such circuit driving the PDP easily generates electromagnetic waves as does subject electric signals to digital processing therein. The electromagnetic waves are also generated by PDP itself. That is, the PDP and its driving circuit are the source of unwanted radiation noise (hereinafter, referred to as EMI (Electro-Magnetic Interference). This is the reason why research and development for a display device having shielding effects has been active to prevent the EMI from leaking to the outside.

Such display device is the one, for example, disclosed in Japanese Patent Laid-Open Publication No. 9-172267. FIG. 25(a) is a slanted view showing the structure of the main body of the display device disclosed in the publication. FIG. 25(b) is a view of a section taken along with a one-dot chain line A–A' shown in (a) of the same drawing, and viewed from the direction of an arrow B. In FIGS. 25(a) and (b), frames 251 are each made of a conductor typified by aluminum, and house a PDP and its driving circuit in a space enclosed thereby. Among those frames 251, a part placed at the rear of the display device is provided with a back cover 252, which is made of plastic. Also among those frames 251, a part placed at the front of the display device is provided with a front cover 253, which is also made of plastic. Therefore, approximately the entire parts inside of the front cover 253 are covered by the conductors (frames 253), and the main body can show the shielding effects.

However, the shielding effects thus provided to the above main body only suppresses the EMI leaking to the outside of the main body, and the EMI radiated from the PDP just loops to the driving circuit side. As a result, signal processing carried out by the driving circuit becomes problematically unstable.

Therefore, an object of the present invention is to provide a display device which can make a driving circuit stably operate with more satisfactory shielding effects.

DISCLOSURE OF THE INVENTION

The above object is attained by the following aspects. Here, those aspects include such specific limited matters as below, and therewith, specific technical effects are achieved.

A first aspect is directed to a display device for displaying a video on a screen thereof, comprising:

a plasma display panel (hereinafter, referred to as PDP (Plasma Display Panel)) structuring the screen;

a circuit board on which a circuit for driving the PDP is arranged;

a chassis formed like a plate made of conductive materials, to one plane thereof, the PDP is attached, and on the other plane thereof, the circuit board is mounted; and an exterior unit being conductive, and housing the PDP and the circuit board having attached to the chassis, wherein the chassis shields the circuit board so as to prevent any unwanted radiation noise emitted by the PDP from looping into the circuit on the circuit board, the exterior unit prevents, with shielding effects, the unwanted radiation noise emitted by the internally-housed PDP and the circuit on the circuit board from leaking to the outside, and the chassis and the exterior unit are electrically insulated from each other.

In the display device according to the first aspect, the chassis shields the circuit, and the exterior unit shows shielding effects. With such double shield structure, the present display device first prevents any unwanted radiation noise emitted by the PDP from looping into the circuit on the circuit board, and thus the driving circuit of the PDP can stably operate. Further, with the double shield structure, unwanted radiation noise from the PDP and the circuit is stopped leaking to the outside of the exterior unit.

A second aspect is directed to a display device for displaying a video on a screen thereof, comprising:

a plasma display panel (hereinafter, referred to as PDP (Plasma Display Panel)) structuring the screen;

a circuit board having a circuit for driving the PDP is arranged on a substrate;

a chassis formed like a plate made of conductive materials, to one plane thereof, the PDP is attached, and on the other plane thereof, the circuit board is mounted;

a cabinet being conductive, and covering a front side of the chassis;

a back cover being conductive, and covering a back side of the chassis; and a bracket being insulative, and fixed to the chassis so as to support the cabinet and the back cover, wherein the cabinet and the back cover are, when covering the chassis to which the PDP and the circuit board are fixed, supported by the bracket, electrically continued, and electrically insulated from the chassis, and thereby show shielding effects, and the chassis is electrically insulated from the circuit, and thereby, shields the circuit board and prevents unwanted radiation noise emitted by the PDP from looping into the circuit.

In the display device according to the second aspect, the cabinet and the back cover house therein the chassis to which the PDP and the circuit on the circuit board are fixed, and electrical continuity is thus established. Therefore, the cabinet and the back cover both show shielding effects. Also, the chassis shields the circuit. With such double shield structure, the present display device first prevents any unwanted radiation noise emitted by the PDP from looping into the circuit on the circuit board, and thus the driving circuit of the PDP can stably operate. Further, with the double shield structure, the unwanted radiation noise from the PDP and the circuit is stopped leaking to the outside of the cabinet and the back cover.

According to a third aspect, in the second aspect, the display device further comprises an adhesive sheet used to attach the PDP to the chassis, and the adhesive sheet is insulative.

According to the third aspect, the PDP can be easily attached to the chassis, and further, the PDP and the chassis can be electrically insulated from each other.

According to a fourth aspect, in the second aspect, in the chassis, a first boss is integrally formed, the substrate is insulative, and in a predetermined position of the substrate, a through hole is formed, and the circuit board is fixed to the first boss by a screw after inserted into the through hole, and thereby, the circuit arranged on the substrate and the chassis are electrically insulated from each other.

According to the fourth aspect, the first boss is integrally formed in the chassis, and thus there is no more need to structure a component in advance to attach the circuit board to the chassis. Accordingly, the number of components of the display device is reduced, and the manufacturing process of the display device can be simplified.

According to a fifth aspect, in the second aspect, the bracket is each attached to four corners of the chassis, and the front cover and the back cover are both supported by the four brackets attached to each of the corners.

According to the fifth aspect, even if the cabinet and back cover are provided with some impactive forces, thus provided impactive forces are not directly given to the chassis, and absorbed by four brackets supporting the cabinet and the back cover. Therefore, the main components of the display device such as the PDP and the circuit board can be protected from the impactive forces coming from the outside.

According to a sixth aspect, in the second aspect, the display device further comprises a base being conductive, and determining a position of the screen with respect to a placement plane by having the chassis attached thereto, wherein the base is electrically insulated from the chassis, and electrical continuity is established with the back cover.

According to the sixth aspect, the base is electrically insulated from the chassis, and electrical continuity is established with the back cover. Therefore, the reception sensitivity for the radio (video signal) is improved in the display device.

According to a seventh aspect, in the second aspect, the display device further comprises:

a top positioning unit having integrally attached to the chassis, and having a cylindrical hole whose center axis is parallel to a vertical direction opened from a flat lower end plane thereof;

an insulation layer formed inside, entirely, and on a lower end plane of the hole;

a base being conductive, and supporting the chassis so as to determine a position of the screen with respect to a placement plane thereof; and a bottom positioning unit shaped like a rod, wherein the base includes a lug in which a through hole is formed, a center axis of the through hole is parallel to the vertical direction, and an upper end plane thereof is formed flat, the bottom positioning unit is fixed to the base by going through the through hole of the base and the hole formed in the top positioning unit, and thereby, the upper end plane of the lug determines a position of the lower end plane of the top positioning unit, and the insulation layer makes the top positioning unit and the base insulated from each other.

With such structure according to the seventh aspect, the base is electrically insulated from the chassis, and electrical continuity is established between the base and the back cover.

According to an eighth aspect, in the second aspect, the display device further comprises a spacer made of conductive materials in which a first through hole is formed, wherein in the chassis, a second boss is integrally formed, at a predetermined position of the back cover, a second through hole is formed, and a screw inserted into the first through hole and the second through hole is fixed to the second boss, and thereby, the back cover is attached to the chassis while kept electrically insulated therefrom.

According to the eighth aspect, the second boss is integrally formed in the chassis, and thus there is no more need to structure a component in advance to attach the circuit board to the chassis. Accordingly, the number of components of the display device is reduced, and the manufacturing process of the display device can be simplified.

Further, with the structure of the eighth aspect, the back cover is attached to the chassis while kept electrically insulated therefrom.

According to a ninth aspect, in the fifth aspect, among the four, the bracket attached on the chassis abuts to the inside of the back cover, and supports the back cover.

According to the ninth aspect, the bracket supports the back cover attached to the chassis. Therefore, displacement of the back cover hardly occurs.

According to a tenth aspect, in the firth aspect, the two brackets fixed on the chassis are each provided with a rib, and the rest are each provided with a screw hole, the cabinet is provided with a hook on the upper part thereof, and a through hole on the lower part thereof, the hook is engaged with and stopped by the ribs, and by the screw inserted into the through hole being fixed to the screw hole, thereby the cabinet is supported by the four brackets.

With the structure of the tenth aspect, the cabinet is attached to the chassis while kept electrically insulated therefrom.

According to an eleventh aspect, in the second aspect, the cabinet and the back cover touch to each other when supported by the brackets.

According to the eleventh aspect, electrical continuity is established between the front cover and the back cover by simply making those touch to each other.

According to a twelfth aspect, in the second aspect, the display device further comprises a base for making the chassis having the PDP and the circuit board attached thereto self-standing, wherein the cabinet and the back cover are each detachable to the brackets.

According to the twelfth aspect, the cabinet and the back cover are each detachable to the brackets. Therefore, in order to access the inside of the display device, there only needs to remove either the front cover or the back cover. That is, according to the twelfth aspect, the accessibility to the inside of the display device can be improved.

According to a thirteenth aspect, in the second aspect, the display device further comprises an elastic solid being conductive, wherein the cabinet and the back cover sandwich the elastic solid when supported by the brackets.

According to the thirteenth aspect, the elastic solid lies between the cabinet and the back cover and thus is closely attached to both of those. Further, the elastic solid is conductive, and thus helps to well establish electrical continuity between the cabinet and the back cover. Therefore, the shielding effects achieved by the cabinet and the back cover can be improved to a greater degree.

BEST MODE FOR CARRYING OUT THE INVENTION

Figure 1:
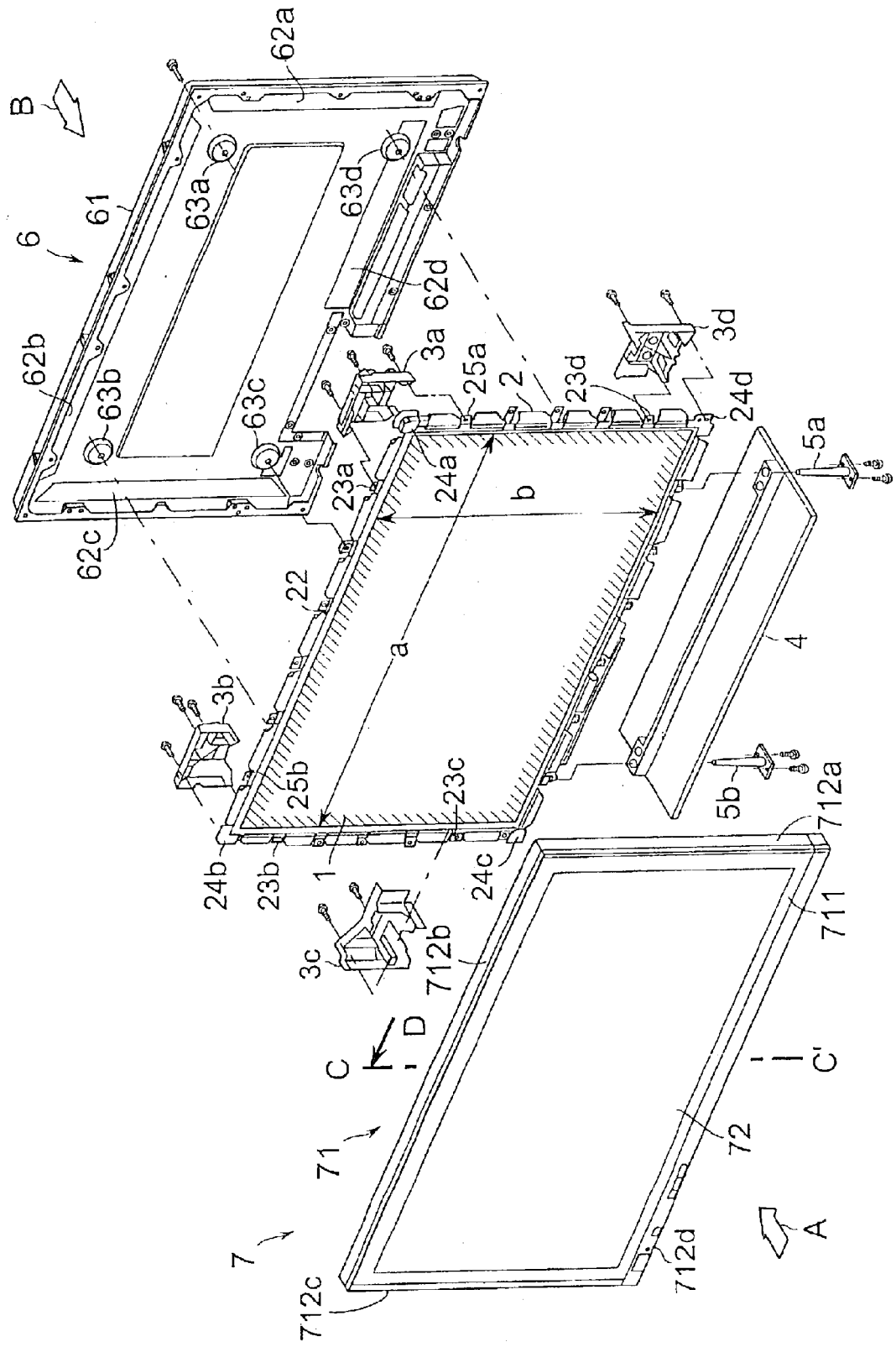
FIG. 1 is an exploded slanted view showing the entire structure of a display device according to a first embodiment of the present invention.

FIG. 1 is a slanted view showing the entire structure of a display device, having a PDP equipped thereto, according to a first embodiment of the present invention. The display device is a device displaying videos on a screen thereof. FIG. 1 shows, as general components for the display device, a PDP (Plasma Display Panel) 1, a chassis 2, four brackets 3a to 3d, a base 4, two bottom positioning units 5a and 5b, a back cover 6, and a cabinet 7. Herein, FIG. 1 shows other components, and those are appropriately described whenever necessary.

The PDP 1 is a part enclosed by slashes. The PDP 1 is the one structured by grids of electrodes encased within two flat glass panels separated from each other by ionizing gas. In such structure, by applying energy to any selected electrode, the gas is ionized, and light is emitted at a predetermined position. By utilizing such phenomenon, the PDP 1 structures a screen for displaying videos thereon. Here, for convenience, presumably, a longer side of the PDP 1 is a in length, and a shorter side thereof is b in length.

Figure 2:
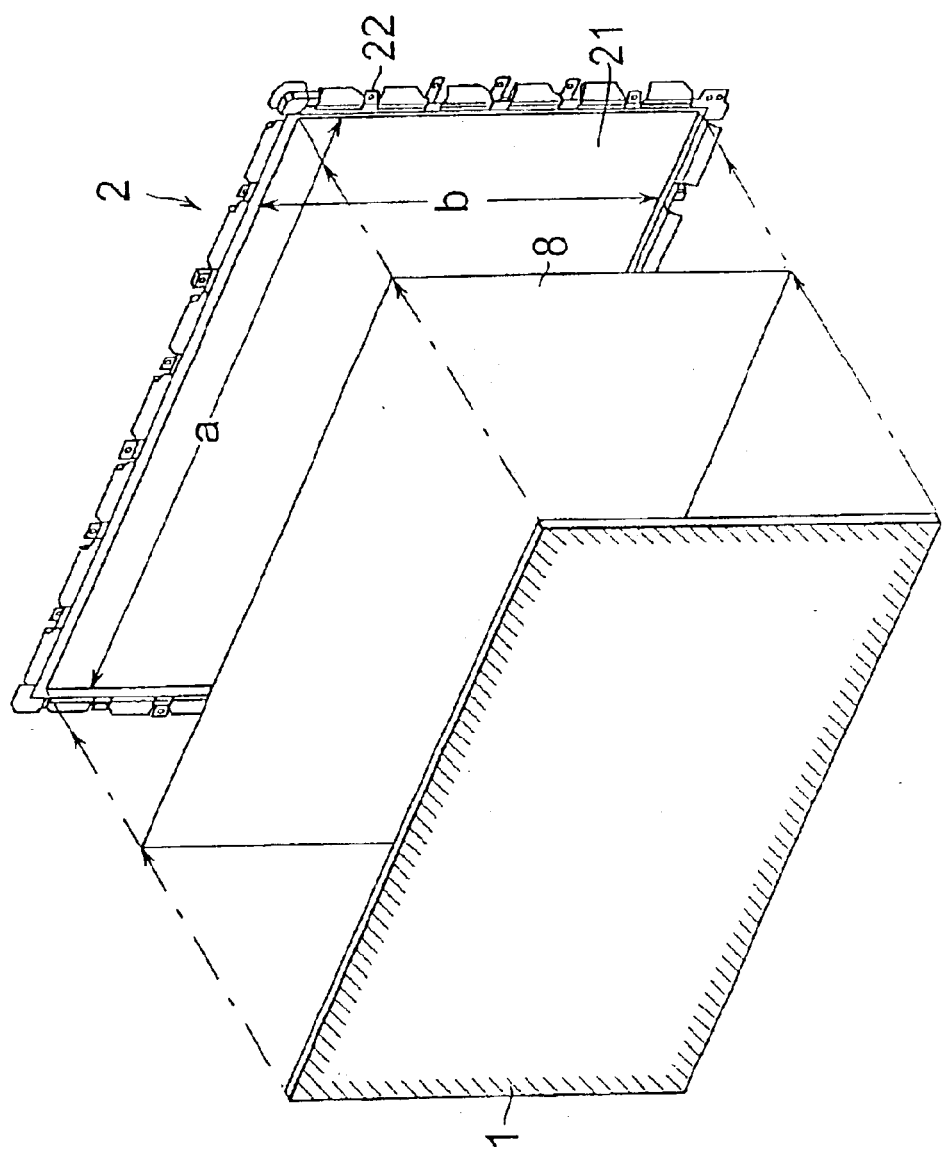
FIG. 2 is a diagram for demonstrating a manner of attaching a PDP 1 to a chassis 2 shown in FIG. 1.

The chassis 2 is made of die-cast conductive materials. As for the conductive materials, aluminum is preferably selected. If so, the display device can be accordingly reduced in weight. As shown in FIG. 2, and the like, the chassis 2 is board-like, and the outer shape thereof is approximately rectangular. One plane 21 of the chassis 2 is formed flat. The plane 21 is formed in accordance with the shape of the PDP 1. In this embodiment, the plane 21 is selected as to be rectangular in shape. Thus, for convenience, a longer side of the plane 21 is also presumed to be a in length, and a shorter side thereof b in length. To the plane 21, the PDP 1 is attached. In this embodiment, as shown in FIG. 2, the PDP 1 is attached to the plane 21 via a double-faced adhesive sheet 8. Here, the adhesive sheet 8 is made of insulation, and adhesive on both sides. This adhesive sheet 8 works as an insulation layer formed between the PDP 1 and the chassis 2, and thus the PDP 1 is attached to the chassis 2 but is electrically insulated therefrom. On the chassis 2, a periphery 22 is formed integrally around the plane 21.

Figure 3:
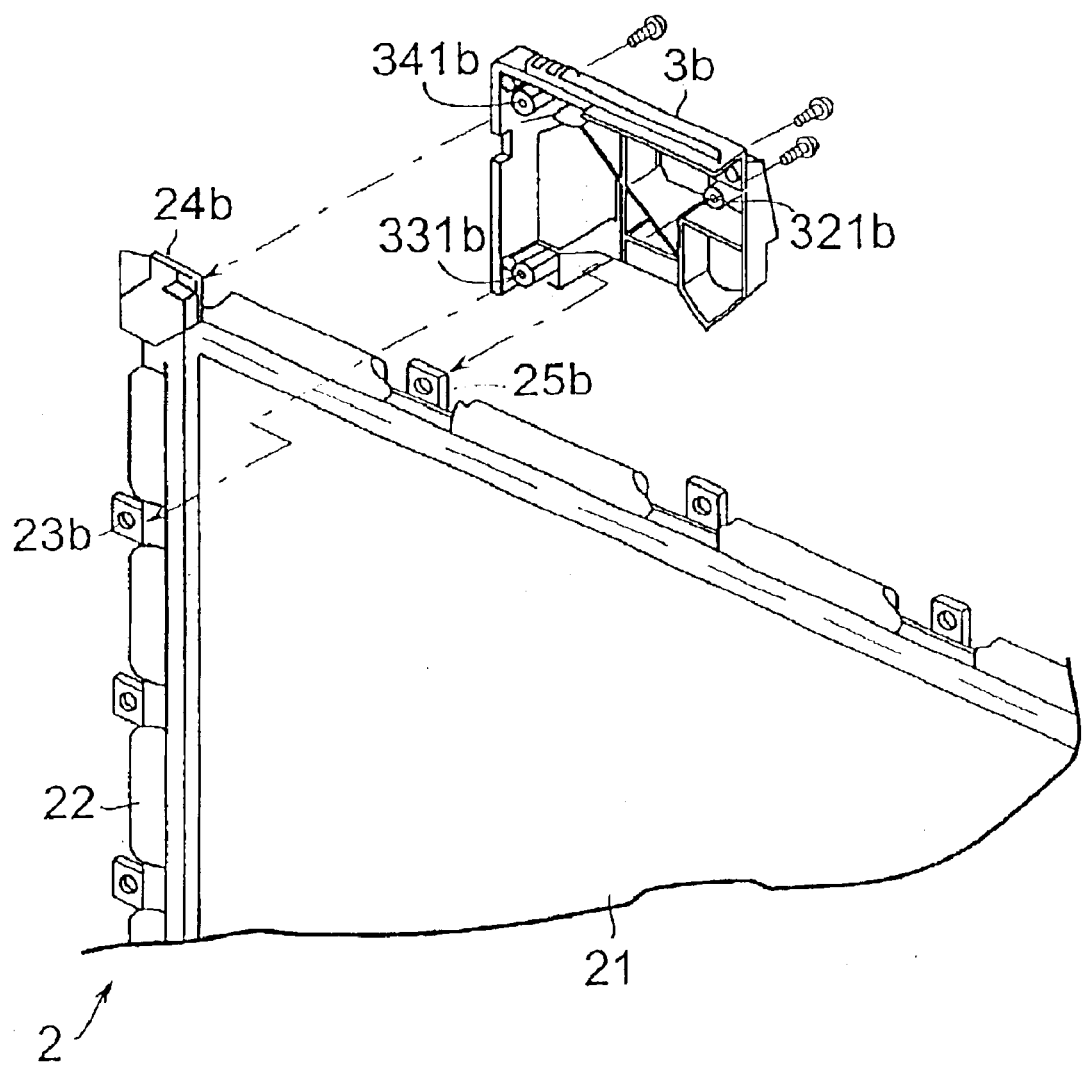
FIG. 3 is an enlarged view of an upper left corner of the chassis 2 shown in FIG. 1.

Refer back to FIG. 1. To each corner of the chassis 2, a bracket fixing part having screw holes formed therein is integrally attached. The screw holes provided in each of the bracket fixing parts are used to fix the brackets 3a to 3d, respectively, to the chassis 2. Here, FIG. 3 is an enlarged view of the area around the upper-left corner of the chassis 2 when viewed from the direction of an arrow A of FIG. 1 (that is, a viewer's point of sight). As for the corner shown in FIG. 3, bracket fixing parts 23b to 25b, which are small and tongue-shaped, are protruding from the periphery 22. The bracket fixing parts 23b to 25b each have a screw hole formed therein to fix the bracket 3b thereto by screws. Similarly, bracket fixing parts 23a to 25a for the bracket 3a are integrally attached to the upper-right corner of the chassis 2 (see FIG. 1). To the lower-left corner of the chassis 2, bracket fixing parts 23c and 24c for the bracket 3c are integrally attached, and to the lower-right corner thereof, integrally attached are bracket fixing parts 23d and 24d for the bracket 3d (see FIG. 1). Here, the bracket fixing parts 23a to 25a, the bracket fixing parts 23c and 24c, and the bracket fixing parts 23d and 24d are all the same as the bracket fixing parts 23b to 25b, differed only in position to be formed at, and thus are neither described nor shown in detail.

Figure 4:
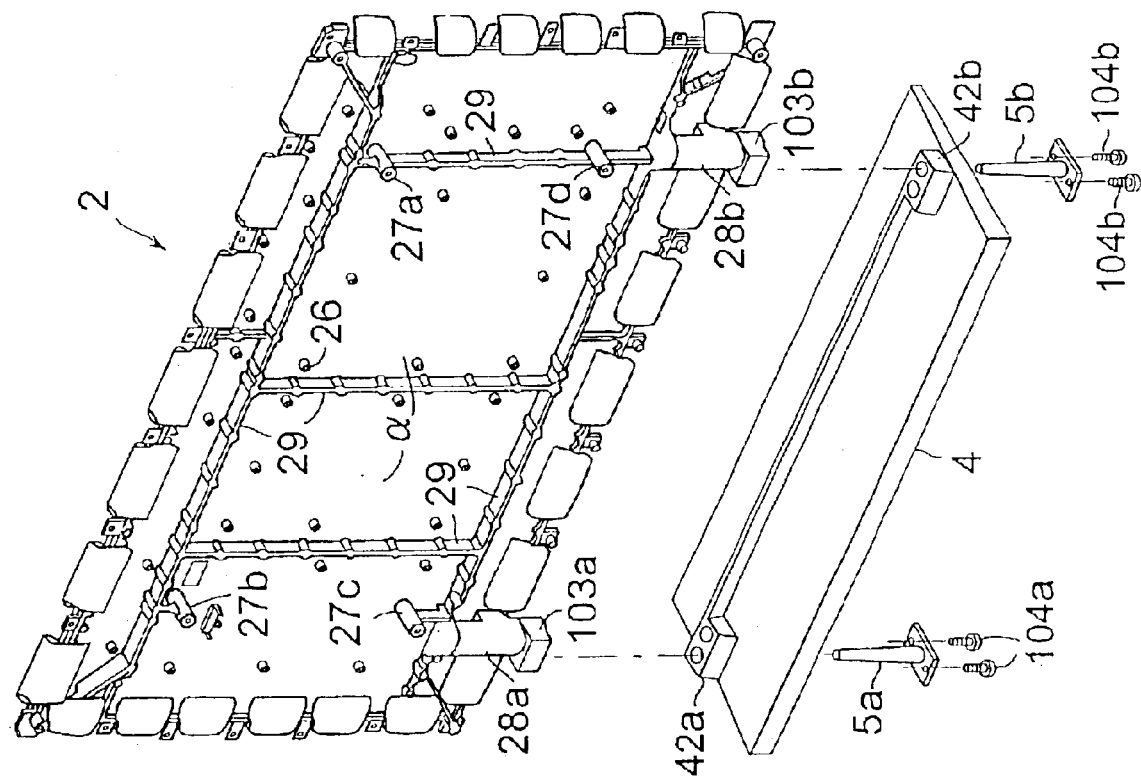
FIG. 4 is a slanted view showing the back of the chassis 2 shown in FIG. 1.

FIG. 4 is a slanted view of the chassis 2 viewed from the direction of an arrow B of FIG. 1. In other words, FIG. 4 is a view of a plane opposite to the plane 21 (back of the chassis 2). In FIG. 4, arranged on the back of the chassis 2 are a first boss 26, second bosses 27a to 27d, top positioning units 28a and 28b, and frames 29.

Note herein that the first boss 26, the second bosses 27a to 27d, the top positioning units 28a and 28b, and the frames 29 are all integrally attached to the chassis 2. With such integral structure, the number of components required to assemble the display device can be reduced. Accordingly, the manufacturing process of the display device can be simplified, and what is better, the manufacturing cost can be reduced.

Figure 5:
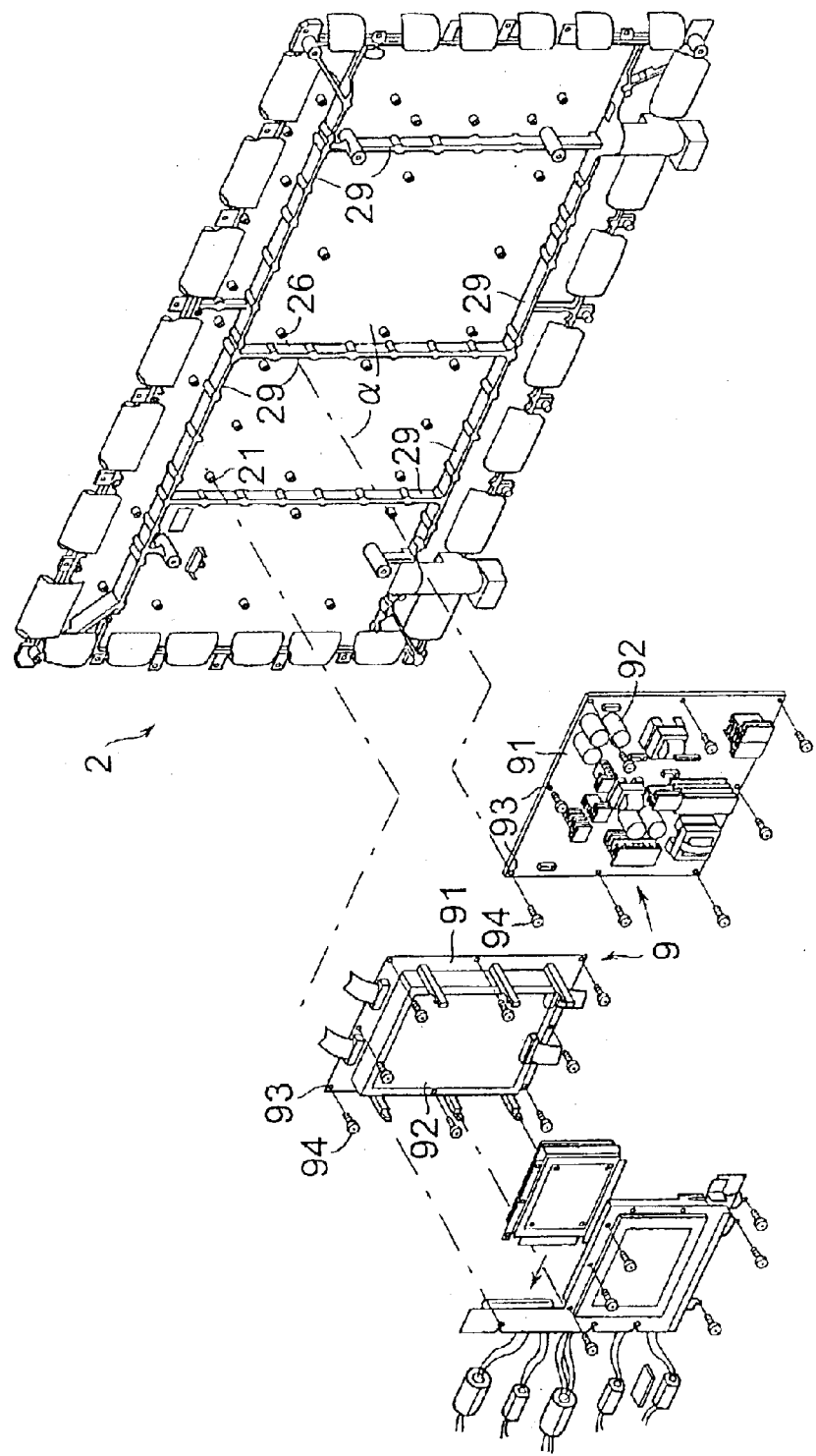
FIG. 5 is a diagram for demonstrating a manner of attaching circuit boards 9.

Here, FIG. 4 shows only one first boss 26, but the actual number thereof is plural as many as through holes 93 formed in circuit boards 9 (see FIG. 5). In each of the first bosses 26, a screw hole is formed. In the second bosses 27a to 27d, a screw hole is each formed to fix the back cover 6 by screws. The top positioning units 28a and 28b are placed on the lower left and right of the chassis 2, and are a part of a positioning unit 10, which will be later described. The frames 29 are formed for the purpose of reinforcing the chassis 2. Further, the frames 29 are arranged in a ladder-shape, and segment a space on the back of the chassis 2. Thus, several spaces α are formed on the back of the chassis 2. The above-described first bosses 26 are each placed within the spaces α.

With reference to FIG. 5, described next is a manner of attaching the circuit boards 9 to the chassis 2 of FIG. 2. In FIG. 5, the circuit board 9 is the one, typically as a PCB (Printed Circuit Board), having various circuit elements and leads for their connections (hereinafter, such circuit elements and leads are collectively referred to as "circuit 92") arranged on a substrate 91 made of insulation. The circuit 92 is typified by a digital signal processing circuit for displaying videos on the PDP 1. Also, each substrate 91 is provided, wherever necessary, with the through holes 93. A screw 94 is first inserted into the corresponding through hole 93, and then fixed to the first boss 26. In this manner, each circuit board 9 is attached to the chassis 2 to be placed in each corresponding space α.

Figure 6:
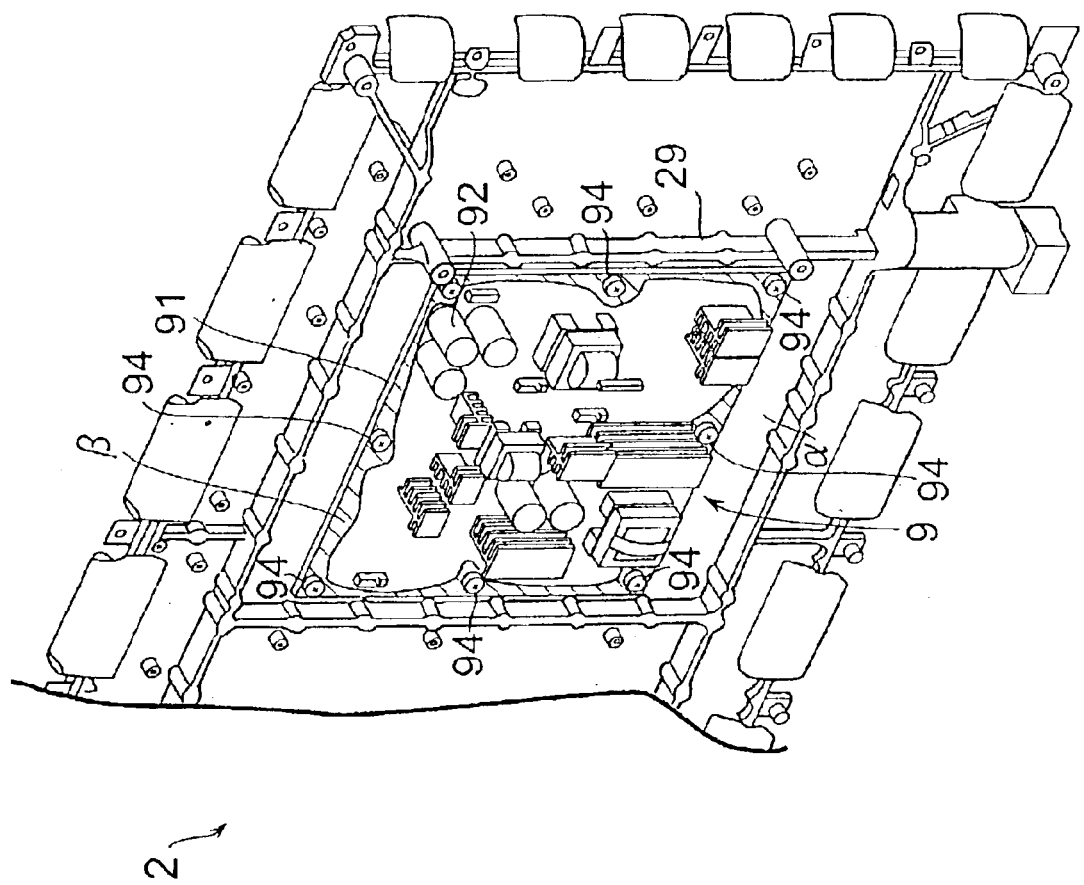
FIG. 6 is a diagram showing the chassis 2 having attached with any one of the circuit boards 9.

FIG. 6 shows the chassis 2 having a certain circuit board 9 attached thereto. Here, for convenience, FIG. 6 only shows the area around the certain circuit board 9 for description. In FIG. 6, a shaded part β shows the area around the screws 94 each fixed to the first bosses 26 (not shown in FIG. 6). The shaded part β has no circuit element and lead structuring the circuit 92 arranged thereon. Therefore, the circuit 92 is mounted to the chassis 2 through the substrate 91 made of insulation, and the circuit 92 and the chassis 2 can be electrically insulated from each other.

Note here also that, as described above, the circuit boards 9 are all arranged to be in the spaces α, and thus the circuit boards 9 are all placed not to stick out from the chassis 2. To be more specific, when the chassis 2 is viewed from the direction of the arrow A of FIG. 1, the circuit boards 9 fit behind the chassis 2 and are completely invisible. The chassis 2 accordingly shields the circuit 92 from the EMI emitted from the PDP 1.

Here, other circuit boards 9 not shown in FIG. 6 are also attached to the chassis 2 similarly to the above. That is, the chassis 2 also shields every other circuit 92 on those circuit boards 9 from the EMI radiated from the PDP 1.

With reference to FIGS. 1 to 6, described above is the arrangement of the PDP 1, the chassis 2, and the circuit boards 9. As already described in the foregoing, the circuits 92 are each electrically insulated from the PDP 1 (see FIGS. 2 and 6). Also, the chassis 2 shields those circuits 92 (see FIG. 6). With such structure, the EMI radiated from the PDP 1 will find difficult to loop towards the circuit boards 9. As a result, the circuits 92 can correctly operate almost without being affected by the EMI.

Figure 7:
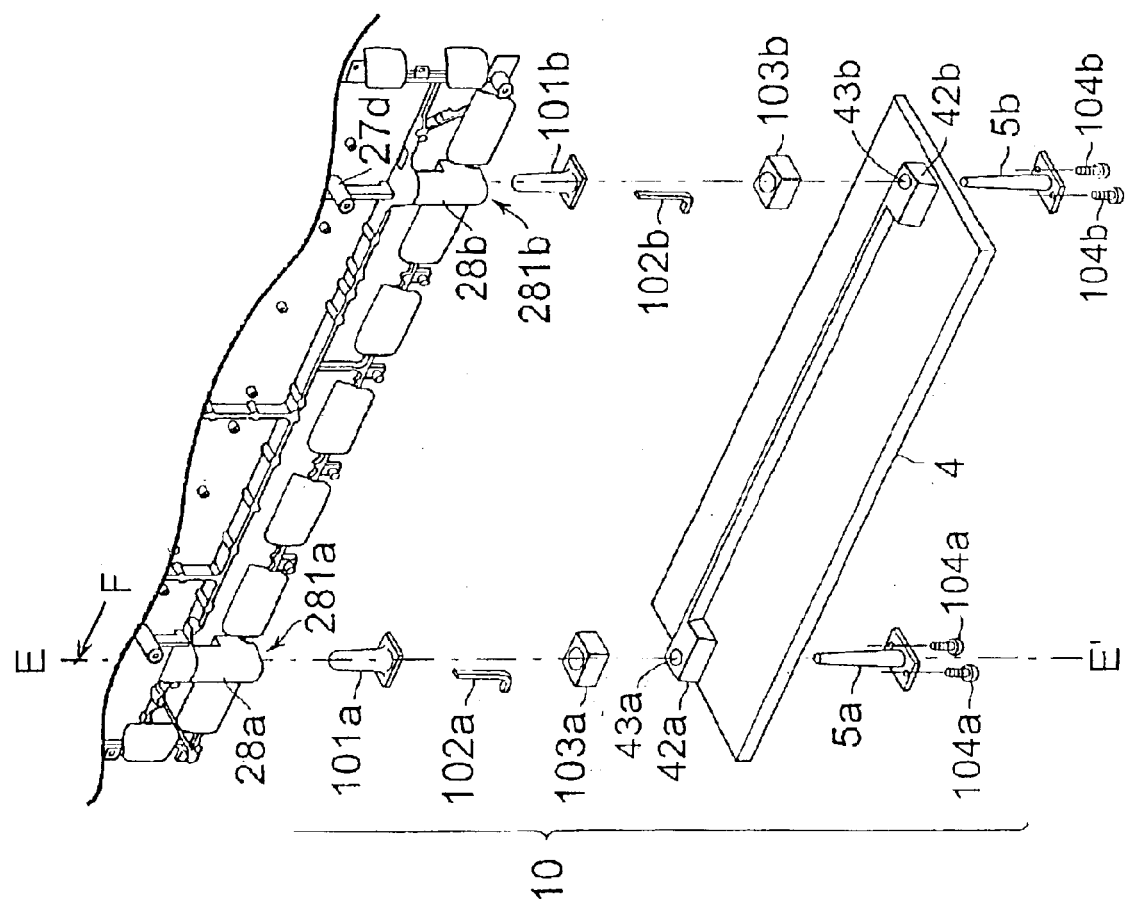
FIG. 7 is an exploded slanted view showing the structure of a positioning unit 10.
Figure 8:
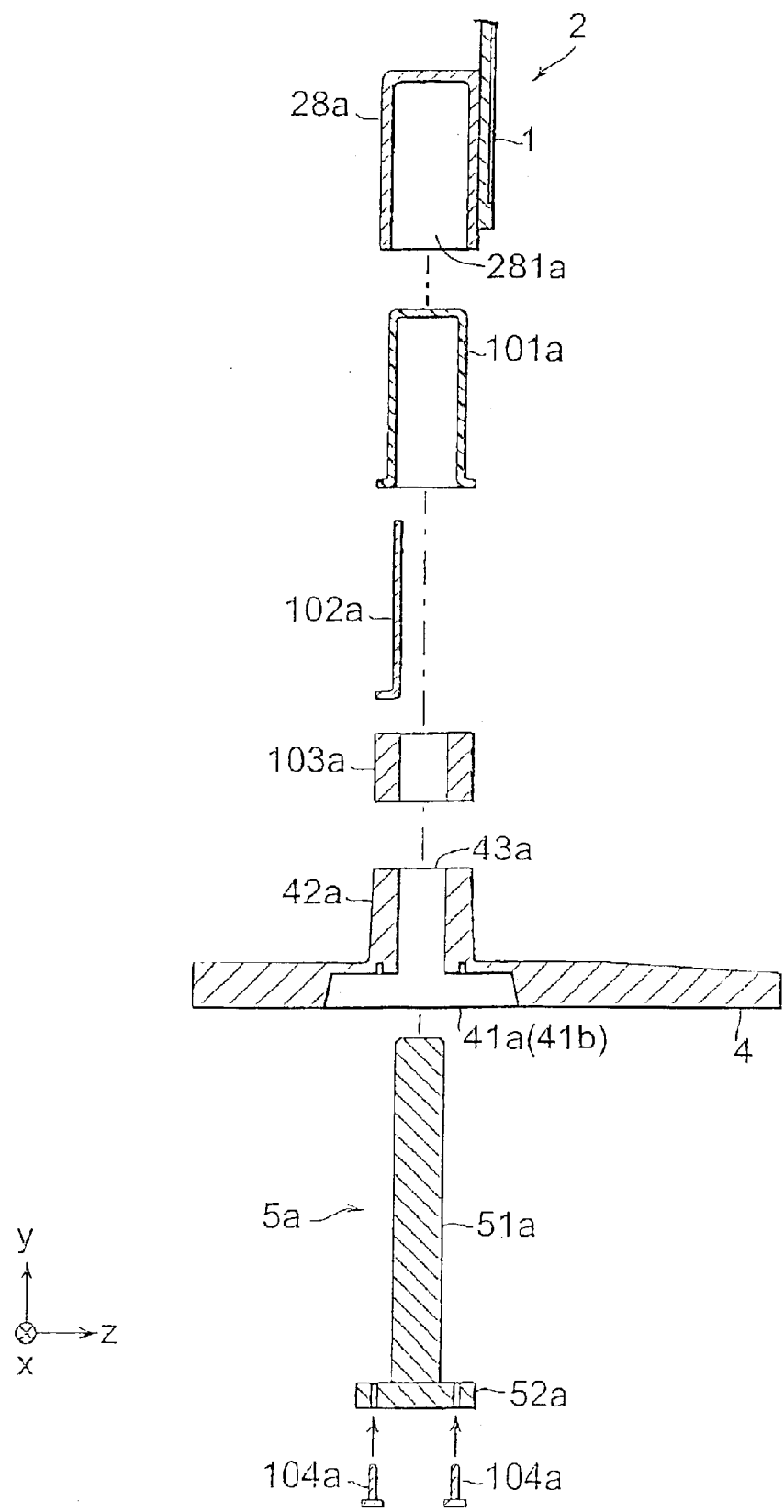
FIG. 8 shows a vertical section of the exploded positioning unit 10 shown in FIG. 7.
Figure 9:
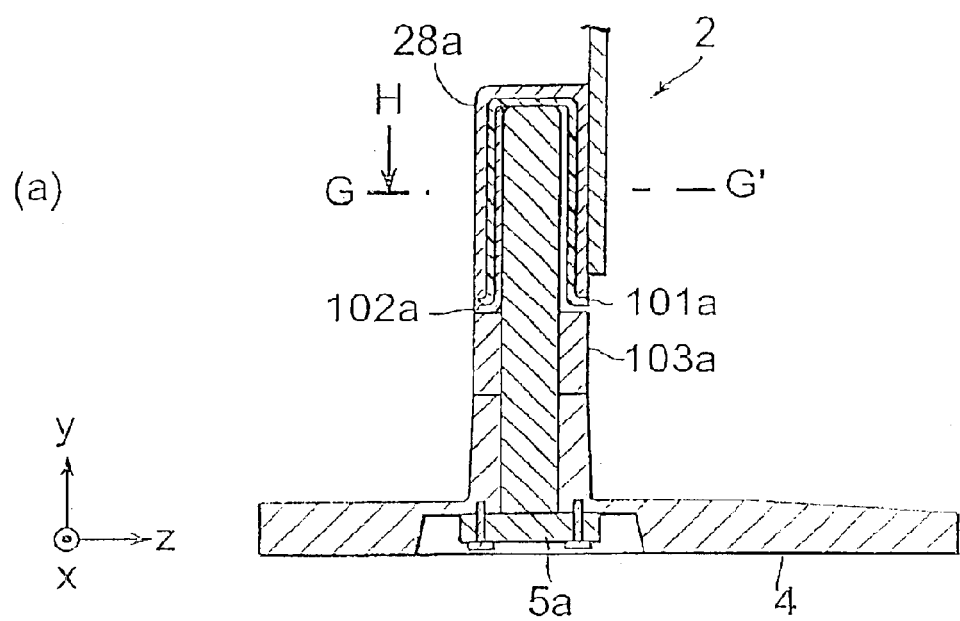
FIG. 9 shows enlarged views of a vertical section and a horizontal section of the positioning unit 10 after assembled.
Figure 9:
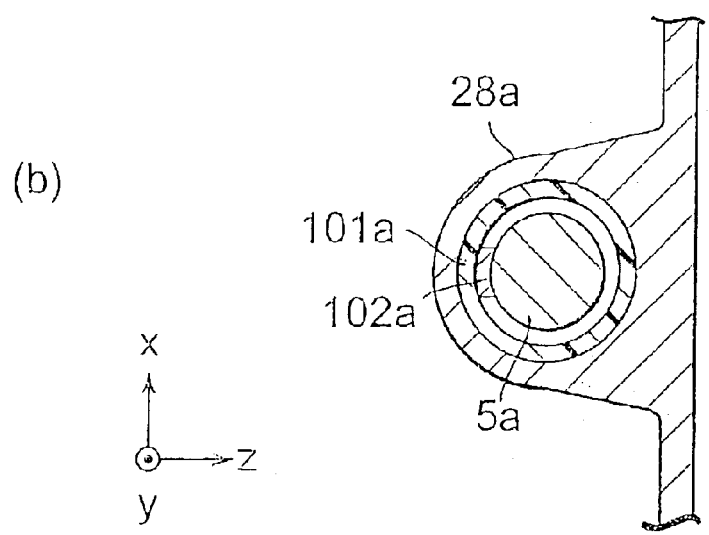

FIG. 7 is an exploded slanted view showing the entire structure of the positioning unit 10. FIG. 8 shows a vertical section of the positioning unit 10 taken along with a line E–E' shown in FIG. 7 and viewed from the direction of an arrow F. FIG. 9(a) shows a vertical section of the positioning unit 10 of FIGS. 7 and 8 after assembled. FIG. 9(b) shows an enlarged view of a horizontal section of the positioning unit 10 taken along with a line G-G' shown in (a) of the same drawing viewed from the direction of an arrow H. Here, for convenience of description below, FIGS. 7 to 9 all show an x-axis, y-axis, and z-axis being orthogonal to one another. Here, the y-axis is an axis parallel to the vertical direction. The z-x plane is a plane parallel to the horizontal plane.

With reference to such FIGS. 7 to 9, described now is about the positioning unit 10. The positioning unit 10 determines the position of the PDP 1 so that the PDP 1 is perpendicular to the placement plane of the completely-assembled display unit (hereinafter, simply referred to as "complete unit"). Here, the positioning unit 10 includes, as shown in FIGS. 7 and 8, the top positioning units 28a and 28b, sacs 101a and 101b, at least two conductive strips 102a and 102b, conductive blocks 103a and 103b, a base 4, and the bottom positioning units 5a and 5b.

The top positioning unit 28a is structured by a barrel-shaped block, a lower plane of which is parallel to the z-x plane. The block has a hole 281a formed therein. As shown in FIG. 8, the hole 281a is so formed as to be approximately cylindrical, and a center axis thereof is parallel to the y-axis. Further, the hole 281a is open at the lower end of the barrel-shaped block, while the upper end of the hole 281a is closed. Here, the top positioning unit 28b is substantially formed the same as the top positioning unit 28a, and thus is neither shown nor described in detail. Such top positioning units 28a and 28b are so placed that, from a center point of the side of the chassis 2 parallel to the x-axis, a distance to the center axis of the hole 281a is equal to a distance to the center axis of the hole 281b.

The sacs 101a and 101b are each made of sheet insulation with a predetermined thickness shaped like a bag. To be more specific, the outer shapes of the sacs 101a and 101b are cylindrical so as to be engageable with the holes 281a and 281b. The upper parts of the sacs 101a and 101b are closed, but the lower parts thereof are open. Further, the sacs 101a and 101b are each formed wider towards the aperture at the bottom, whereby the lower plane is formed to be parallel to the z-x plane. The lower planes of the sacs 101a and 101b are so formed as to fit to the shapes of the lower planes of the top positioning units 28a and 28b.

The conductive strips 102a and 102b are made of conductive materials, and the longer sides thereof are each so determined in length as to cover the depth of the holes 281a and 281b. On the other hand, the shorter sides of the conductive strips 102a and 102b are so determined as to be fit inside of the holes of the sacs 101a and 101b.

The conductive blocks 103a and 103b are made of conductive materials formed almost in rectangular parallelepiped. The conductive blocks 103a and 103b each have a through hole formed therein, and a diameter thereof is substantially the same as that of the holes 281a and 281b, respectively.

The base 4 is made of conductive materials formed in plate, and supports the chassis 2 in such state that the PDP 1 is positioned with respect to the placement plane. Here, as is supporting a complete unit, the base 4 is preferably made of high-density metal. The lower plane of the base 4 is formed to be parallel to the z-x plane, and if the complete unit is immovably placed, that is the part where abutting to the position for placement (e.g., floor). Also, the lower plane has recesses 41a and 41b (see FIG. 8) formed therein with a predetermined interval, and the recesses 41a and 41b each have a screw hole formed therein.

Lugs 42a and 42b are formed on the upper plane of the base 4 to be directly above the recesses 41a and 41b. The upper planes of the lugs 42a and 42b are formed to be parallel to the z-x plane.

Further, formed in the base 4 is a cylindrical through hole 43a, which goes through the recess 41a and the lug 42a. Similarly, another cylindrical through hole 43b going through the recess 41b and the lug 42b is formed. Note herein that, as for the base 4, center axes of the through holes 43a and 43b are both so determined as to locate substantially equal from the center of the side parallel to the x-axis, and designed as to be substantially parallel to the y-axis. Also, a distance between those center axes of the through holes 43a and 43b is substantially equal to a distance between the center axes of the holes 281a and 281b. Further, the through holes 43a and 43b are substantially equal in internal diameter to the sacs 101a and 101b.

The bottom positioning unit 5a is made of conductive materials, and as shown in FIG. 8, includes a rod 51a and a head 52a. The outer diameter of the rod 51a is substantially the same as the internal diameter of the sac 101a. The longitudinal length of the rod 51a is so determined as to reach the bottom of the sac 101a when the positioning unit 10 is assembled. The head 52a is a plate-type member having through holes formed in the vicinity of both ends thereof. To one end of the rod 51a, the center part of the head 52a is attached. The bottom positioning unit 5b is substantially the same as the bottom positioning unit 5a, and thus is not described again.

With reference to FIGS. 7 to 9, described next is a manner of assembling such structured positioning unit 10. First, the rod 51a and a rod 51b go through the through holes 43a and 43b, respectively. Then, screws 104a and 104b go through the through holes of the head 51a and a head 51b, respectively, and are fixed to screw holes formed in the recesses 41a and 41b. In this manner, the bottom positioning units 5a and 5b are both fixed to the base 4. At this time, the rods 51a and 51b partially protrude from the lugs 42a and 42b. The parts protruding from the lugs 42a and 42b go through the through holes of the conductive blocks 103a and 103b.

Here, to the inner wall of the sac 101a, the conductive strip 102a is fixed. At this time, preferably, one end of the conductive strip 102a is so fixed as to abut to the bottom of the hole. The conductive strip 102a is then fixed along the inner wall starting from the bottom of the hole towards the aperture. The conductive strip 102a is then bent outward at the aperture, and the other end thereof is fixed on the lower plane of the sac 101a. Similarly to the conductive strip 102a, the conductive strip 102b is fixed to the sac 101b. The sacs 101a and 101b are, after the conductive strips 102a and 102b are respectively fixed therein, each pushed into the hole 281a of the top positioning unit 28a and the hole 281b of the top positioning unit 28b.

The rods 51a and 51b protruding from the conductive blocks 103a and 103b are inserted into the holes 281a and 281b, wherein the sacs 101a and 101b are now engaged. Thereafter, although not shown in detail, the top positioning unit 28a and the bottom positioning unit 5a are fixed to each other by screws, and the top positioning unit 28b and the bottom positioning unit 5b are also fixed to each other by screws. As a result, the chassis 2 is correctly positioned on the upper planes of the lugs 42a and 42b through the conductive blocks 103a and 103b. Accordingly, the screen of the PDP 1 is positioned perpendicular to the placement plane (that is, the lower plane of the base 4).

Note herein that, as shown in FIGS. 9(a) and (b), the sac 101a works as an insulation layer (see back-slashed parts) on the lower plane of the top positioning unit 28a and the inner wall of the hole 281a thereof. Onto the inner wall of the hole formed in the sac 101a, the conductive strip 102a is attached. Similarly, the sac 101b works as an insulation layer on the lower plane of the top positioning unit 28b and the inner wall of the hole 281b thereof. Onto the inner wall of the hole formed in the sac 101b, the conductive strip 102b is attached. With such structure, once the positioning unit 10 is assembled, electrical continuity is established between the base 4 and the conductive block 103a through the bottom positioning unit 5a and the conductive strip 102a. Electrical continuity is also established therebetween if the base 4 directly abuts to the conductive block 103a. Similarly, electrical continuity is established between the base 4 and the conductive block 103b. However, by the sacs 101a and 101b working as insulation layers, the base 4 and the chassis 2 made of aluminum are electrically insulated from each other.

Figure 10:
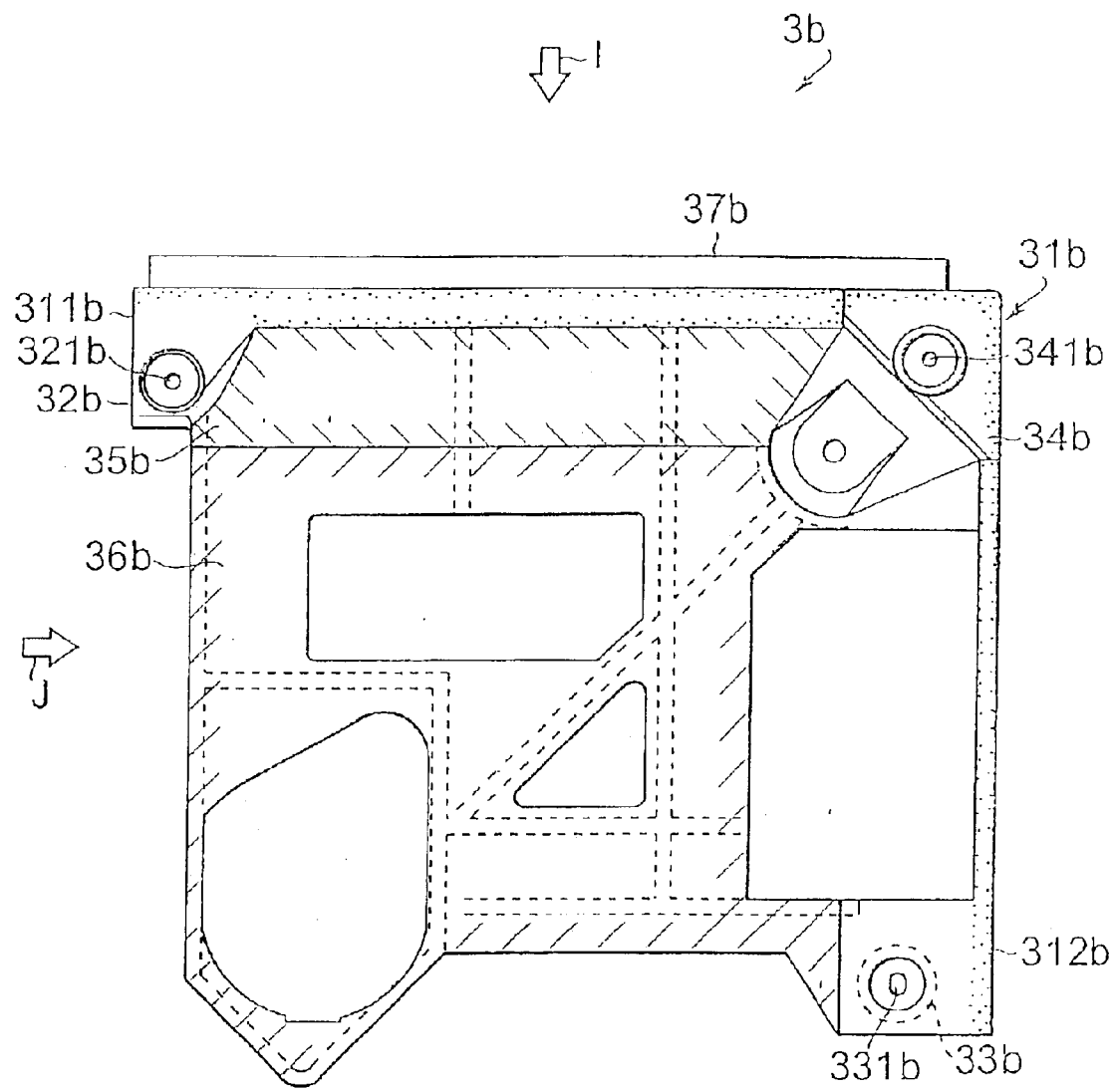
FIG. 10 is a front view of a bracket 3b of FIG. 1.
Figure 11:
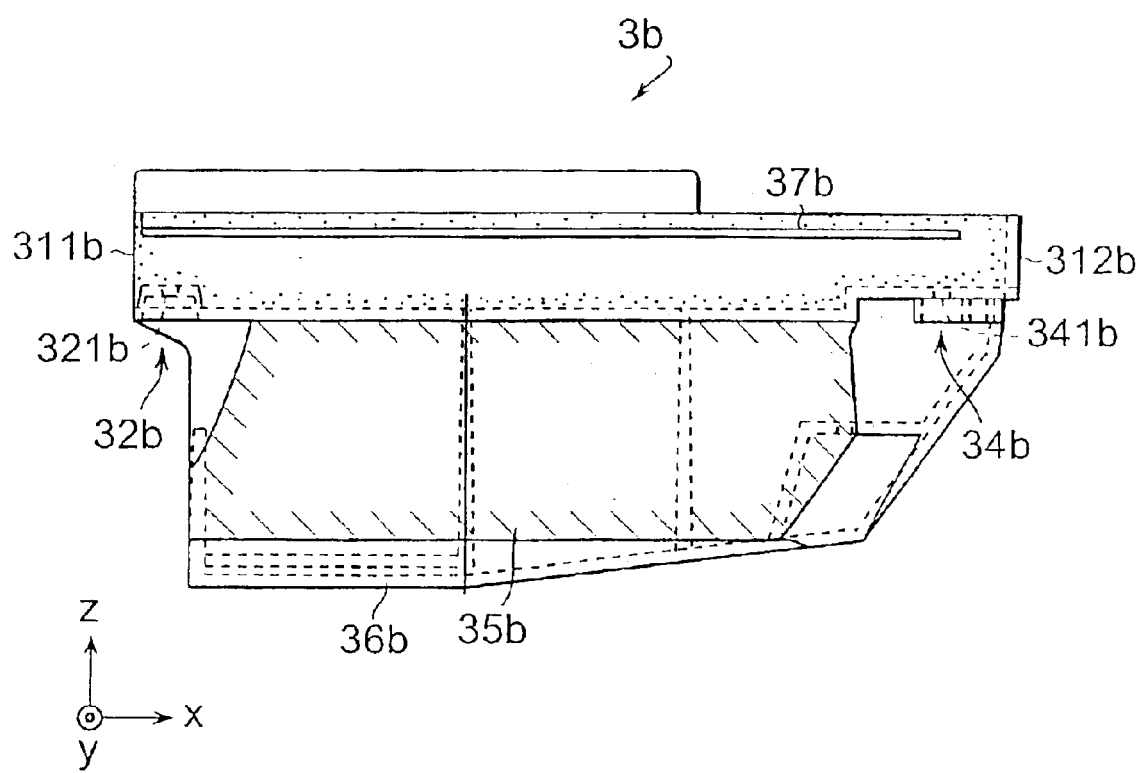
FIG. 11 is a top view of the bracket 3b of FIG. 1.
Figure 12:
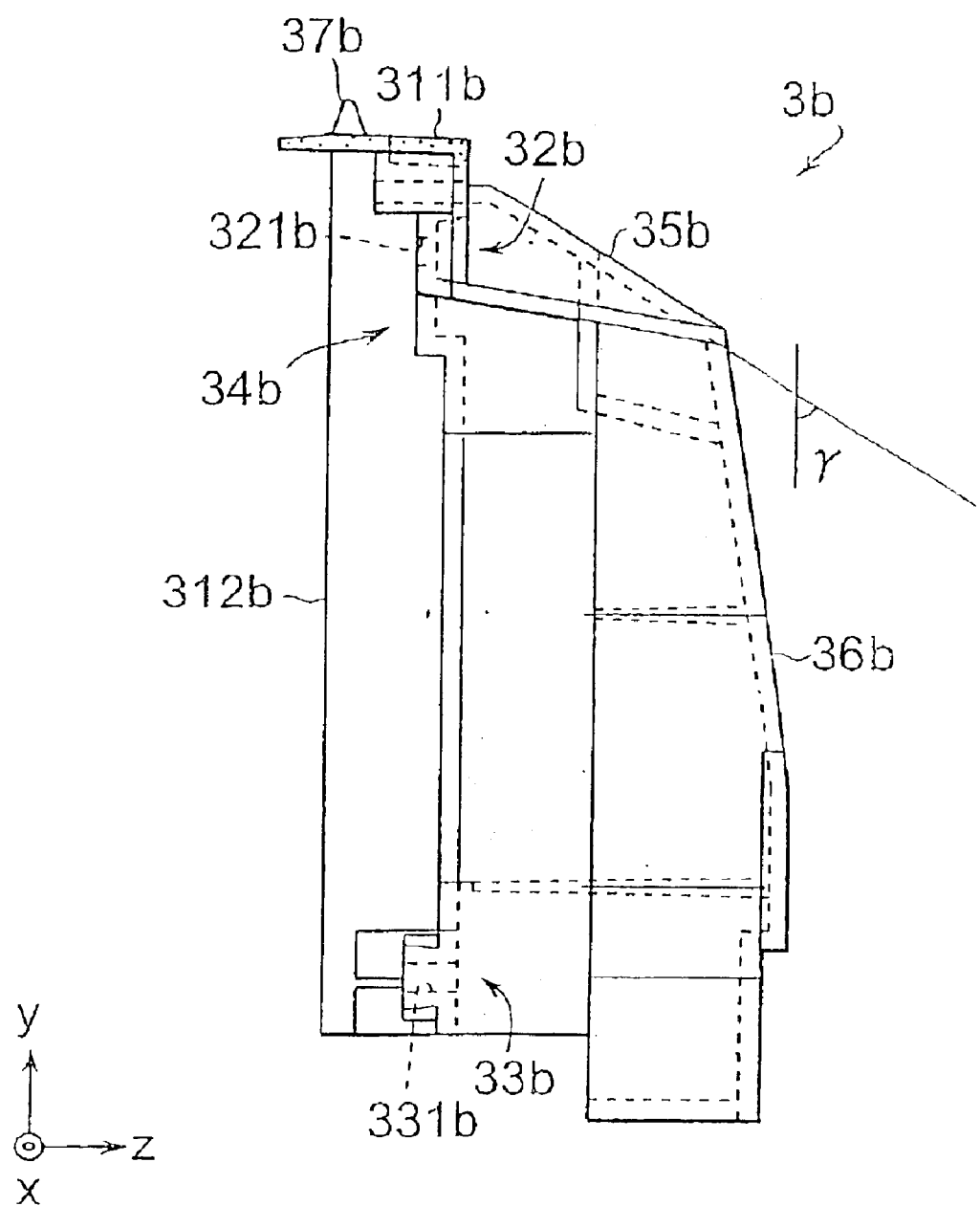
FIG. 12 is a side view of the bracket 3b of FIG. 1.

FIG. 10 is a front view of the bracket 3b. To make clear the relation with FIG. 1, shown in FIG. 10 is only the bracket 3b viewed from the direction of the arrow B of FIG. 1. FIG. 11 is a top view of the bracket 3b, and the bracket 3b is viewed from the direction of an arrow I of FIG. 10. FIG. 12 is a side view of the bracket 3b, and the bracket 3b is viewed from the direction of an arrow J of FIG. 10. For convenience of description below, FIGS. 10 to 12 all show an x-axis, y-axis, and z-axis being orthogonal to one another. Here, the y-axis is an axis parallel to the vertical direction. The z-x plane is a plane parallel to the horizontal plane. Described below is about the bracket 3b with reference to FIGS. 10 to 12.

In FIGS. 10 to 12, the bracket 3b is injection molded and made of insulation. The bracket 3b includes, generally, a frame 31b, chassis fixing members 32b to 34b, a joint member 35b, a top plate 36b, and a rib 37b. The frame 31b is a part enclosed by dots in FIGS. 10 to 12. The frame 31b is structured by two plates 311b and 312b which are so connected as to form an angle, substantially, of 90 degrees. In FIG. 10, the upper and lower surfaces of the plate 311b are indicated parallel to the z-x plane, and the center axis thereof is indicated parallel to the x-axis. Also, therein, the right and left surfaces of the plate 312b are indicated parallel to the y-z plane, and the center axis thereof is indicated parallel to the y-axis.

The chassis fixing members 32b to 34b are members to fix the bracket 3b to the back of the corner located at the upper left of the chassis 2. Described below is an exemplary specific structure of the chassis fixing members 32b to 34b. The chassis fixing member 32b is in the shape of tongue, and protrudes from one end of the plate 311b (which is left end in FIG. 10) to be parallel to the x-y plane. Formed in the chassis fixing member 32b is a through hole 321b, a center axis of which is parallel to the z-axis (see FIG. 12). The chassis fixing member 33b is also in the shape of tongue, and protrudes from one end of the plate 312b (which is lower end in FIG. 10) to be parallel to the x-y plane. Formed in the chassis fixing member 33b is a through hole 331b, a center axis of which is parallel to the z-axis (see FIG. 12). Also, the chassis fixing member 34b is in the shape of tongue, and protrudes from the other ends of the plates 311b and 312b (which are right end of the plate 311b, and upper end of the plate 312b in FIG. 10) to be parallel to the x-y plane. Formed in the chassis fixing member 34b is a through hole 341b, a center axis of which is parallel to the z-axis (see FIG. 11). Here, all undersides of the chassis fixing members 32b to 34b are included in a single plane parallel to the x-y plane.

The joint member 35b is a back-slashed part in FIGS. 10 and 11. The joint member 35b is a plate-type member almost in rectangular, and used to join the frame 311b and the top plate 36b to each other. As shown in FIG. 10, the joint member 35b is so arranged in between the chassis fixing members 32b and 33b. One end of the joint member 35b is integrally connected to the lower end of the plate 311b of FIGS. 10 to 12, and the other end thereof is integrally connected to one side of the top plate 36b. Note here that the surface of the joint member 35b is a part of the plane orthogonal to the x-y plane, and as shown in FIG. 12, forms a predetermined angle γ with respect to the x-y plane. The range of the angle γ is determined by the relationship between the back cover 6, which will be later described.

The top plate 36 is a slashed-part in FIG. 10. As shown in FIGS. 10 to 12, the top plate 36 is a member integrally connected to the lower end of the joint member 35b, and is a plate-type member almost in rectangular. In the top plate 36, radiation holes varying in shape are formed, and each of those radiation holes dissipates heat from the chassis 2.

In FIGS. 10 to 12, the upper surface of the plate 311b is formed substantially flat. The rib 37b is a member to hook a hook 713 (see FIG. 20). In this embodiment, as an exemplary specific structure, the rib 37b is so formed, on the upper surface of the plate 311b, as to extend along the x-axis direction and protrude to the y-axis direction.

Described next is a manner of attaching the bracket 3b to the chassis 2 with reference to FIG. 3. Into three through holes 321b to 341b, a single screw is each inserted. Those screws inserted thereinto are each fixed to the screw hole formed respectively in the bracket fixing parts 23b to 25b. Here, when the bracket 3b is fixed to the chassis 2, the back planes of the chassis fixing member 32b to 34b each abut to the bracket fixing parts 23b to 25b. Further, the back planes of the chassis fixing members 32b to 34b, as already described, form the plane flat to the x-y plane. Therefore, the bracket 3b is securely and firmly fixed to the chassis 2.

This is the end of the description about the bracket 3b. Here, the bracket 3a is substantially symmetric in shape to the bracket 3b, and thus is neither shown nor described in detail. Here, in description below, as for the bracket 3a, any constituent similar in structure to the bracket 3b is provided with the same reference numeral. Note that, the alphabetic letter "b" found at the right end of each reference numeral is replaced by "a". For example, the rib formed on the bracket 3a will be a rib 3a. The bracket 3a is, similar to the bracket 3b, attached to the back of the corner located at the upper right of the chassis 2.

Figure 13:
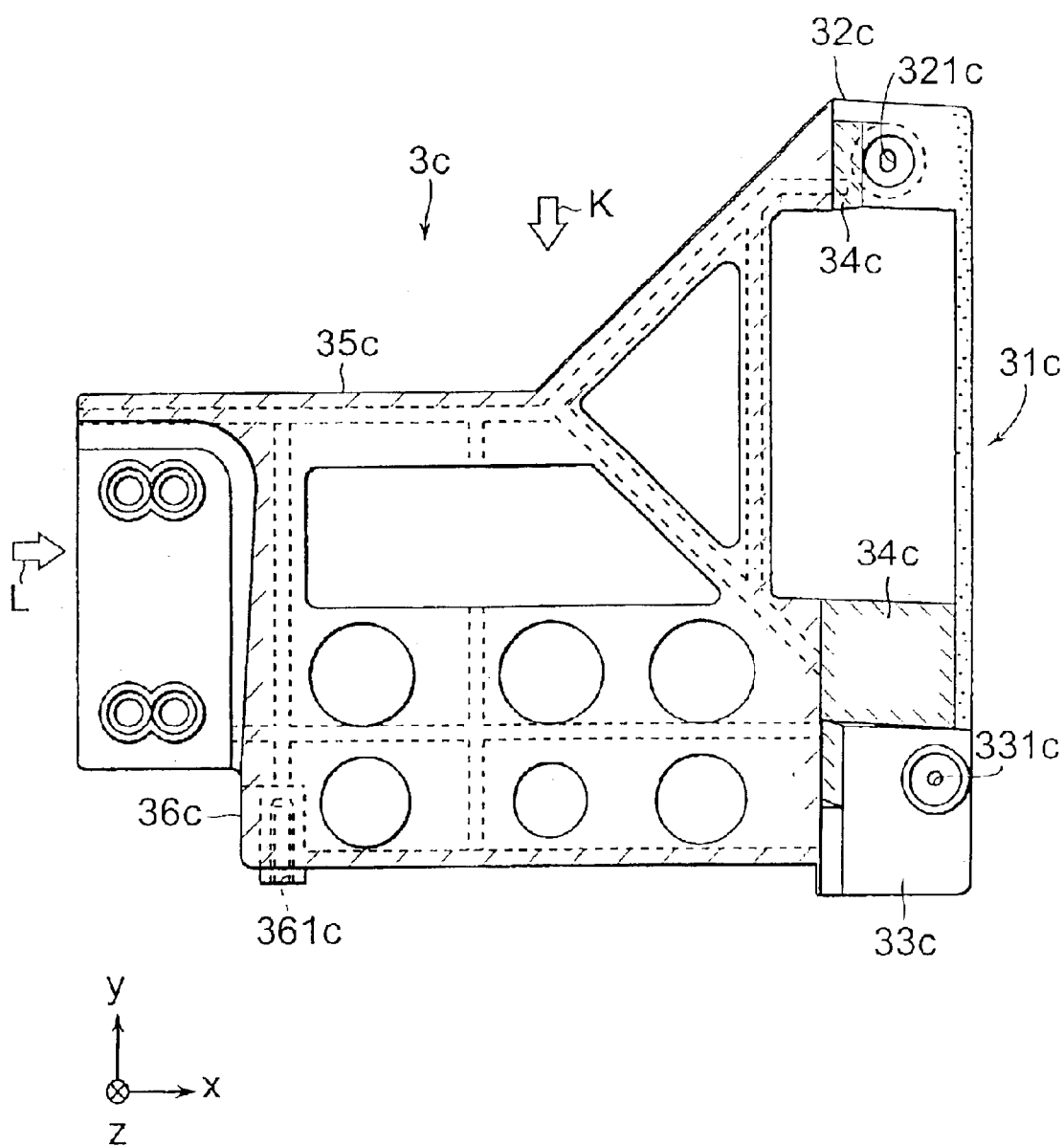
FIG. 13 is a front view of a bracket 3c of FIG. 1.
Figure 14:
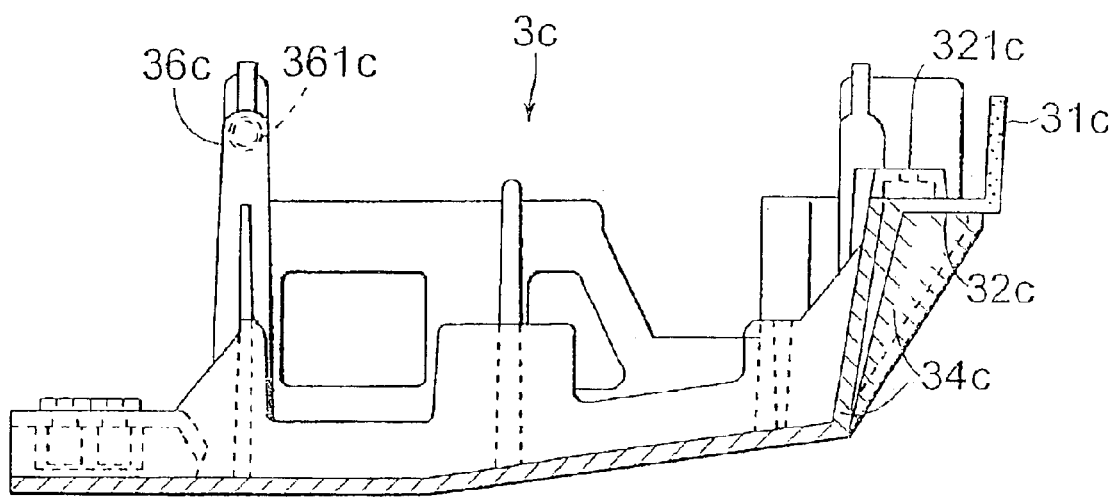
FIG. 14 is a top view of the bracket 3c of FIG. 1.
Figure 15:
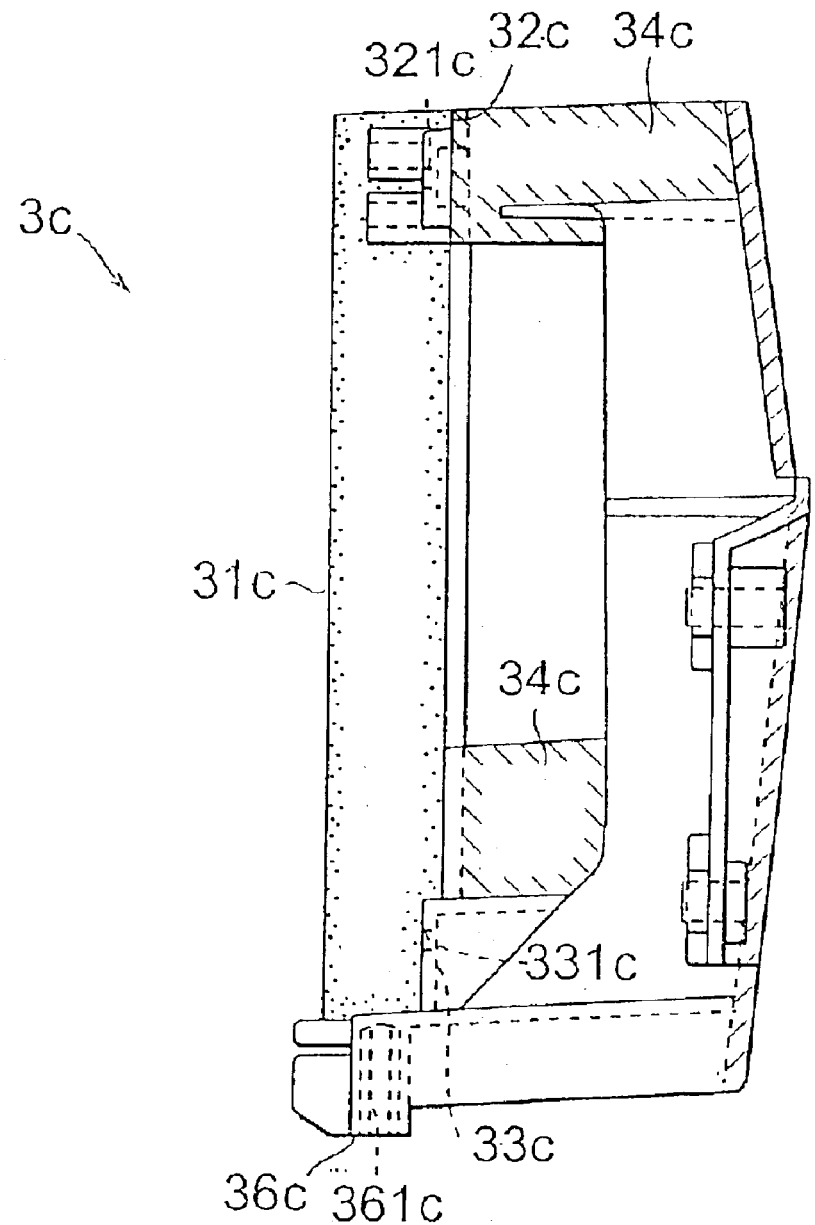
FIG. 15 is a side view of the bracket 3c of FIG. 1.

FIG. 13 is a front view of the bracket 3c. To make clear the relation with FIG. 1, shown in FIG. 13 is only the bracket 3c viewed from the direction of the arrow B of FIG. 1. FIG. 14 is a top view of the bracket 3c, and the bracket 3c is viewed from the direction of an arrow K of FIG. 13. FIG. 15 is a side view of the bracket 3c, and the bracket 3c is viewed from the direction of an arrow L of FIG. 13. For convenience of description below, FIGS. 13 to 15 all show an x-axis, y-axis, and z-axis being orthogonal to one another. Here, the y-axis is an axis parallel to the vertical direction. The z-x plane is a plane parallel to the horizontal plane. Described below is about the bracket 3c with reference to FIGS. 13 to 15.

In FIGS. 13 to 15, the bracket 3c is injection molded and made of insulation. The bracket 3c includes, generally, a frame 31c, chassis fixing members 32c to 33c, a joint member 34c, a top plate 35c, and a cabinet fixing member 36c. The frame 31c is a part indicated by dots. The frame 31c is a plate-type member almost in rectangular, and as shown in FIG. 13, the side planes thereof are indicated parallel to the y-z plane, and the center axis thereof is indicated parallel to the y-axis.

The chassis fixing members 32c and 33c are members used to fix the bracket 3c to the back of the chassis 2 at the lower left. Described below is an exemplary specific structure of the chassis fixing members 32c and 33c. The chassis fixing member 32c is in the shape of tongue, and protrudes from one end of the frame 31c (which is upper end in FIG. 13) to be parallel to the x-y plane. Formed in the chassis fixing member 32c is a through hole 321c, a center axis of which is parallel to the z-axis (see FIG. 14). The chassis fixing member 33c is also in the shape of tongue, and protrudes from the other end of the frame 31c (which is lower end in FIG. 13) to be parallel to the x-y plane. Formed in the chassis fixing member 33c is a through hole 331c, a center axis of which is parallel to the z-axis (see FIG. 13). Here, all undersides of the chassis fixing members 32c and 33c are included in the same x-y plane so that the bracket 3c is fixable to the chassis in a firm manner (see FIG. 15).

The joint members 34c are back-slashed parts. The joint members 34c are members to integrally couple the frame 31c and the top plate 35c. In this embodiment, the joint members 34c are rod-like members protruding in the z direction from one end of the chassis fixing members 32c and 33c, respectively, and from a part of the frame 31c.

The top plate 35c is a part covered by slashes. In this embodiment, the top plate 35c is a plate-type member integrally connected to the upper ends of the joint members 34c. In the top plate 35c, several radiation holes are formed, and each of those radiation holes dissipates heat from the chassis 2.

The cabinet-fixing member 36c is a member used to fix the cabinet 7 to the bracket 3c. As an exemplary specific example, the cabinet fixing member 36c is structured by a rod-like member protruding along the z direction from the lower end part of the top plate 35c. At the tip of the rod-like member, a screw hole 361c is formed.

Described next is a manner of attaching the bracket 3c to the chassis 2. Note that, this manner is similar to the one applied to the bracket 3d, and thus is described without referring to any specific drawing but to FIG. 1, and FIGS. 13 to 15. Into the through holes 321c to 331c, a single screw is each inserted. Those screws inserted thereinto are each fixed to the screw hole formed respectively in the bracket fixing parts 23c to 24c. Here, once the bracket 3c is fixed to the chassis 2, the back planes of the chassis fixing member 32c and 33c abut to the bracket fixing parts 23c and 24c, respectively. Further, the back planes of the chassis fixing members 32c and 33c form a plane flat to the x-y plane, therefore, the bracket 3c is securely and firmly fixed to the chassis 2. This is the end of the description about the bracket 3c. Here, the bracket 3d is substantially symmetric in shape to the bracket 3c, and thus is neither shown nor described in detail. Here, in description below, as for the bracket 3d, any constituent similar in structure to the bracket 3c is provided with the same reference numeral. Note that, the alphabetic letter "c" found at the right end of each reference numeral is replaced by "d". For example, the top plate formed on the bracket 3d will be a top plate 35d. The bracket 3d is, similar to the bracket 3c, attached to the back side of the corner located at the lower right (see FIG. 1) of the chassis 2.

Figure 16:
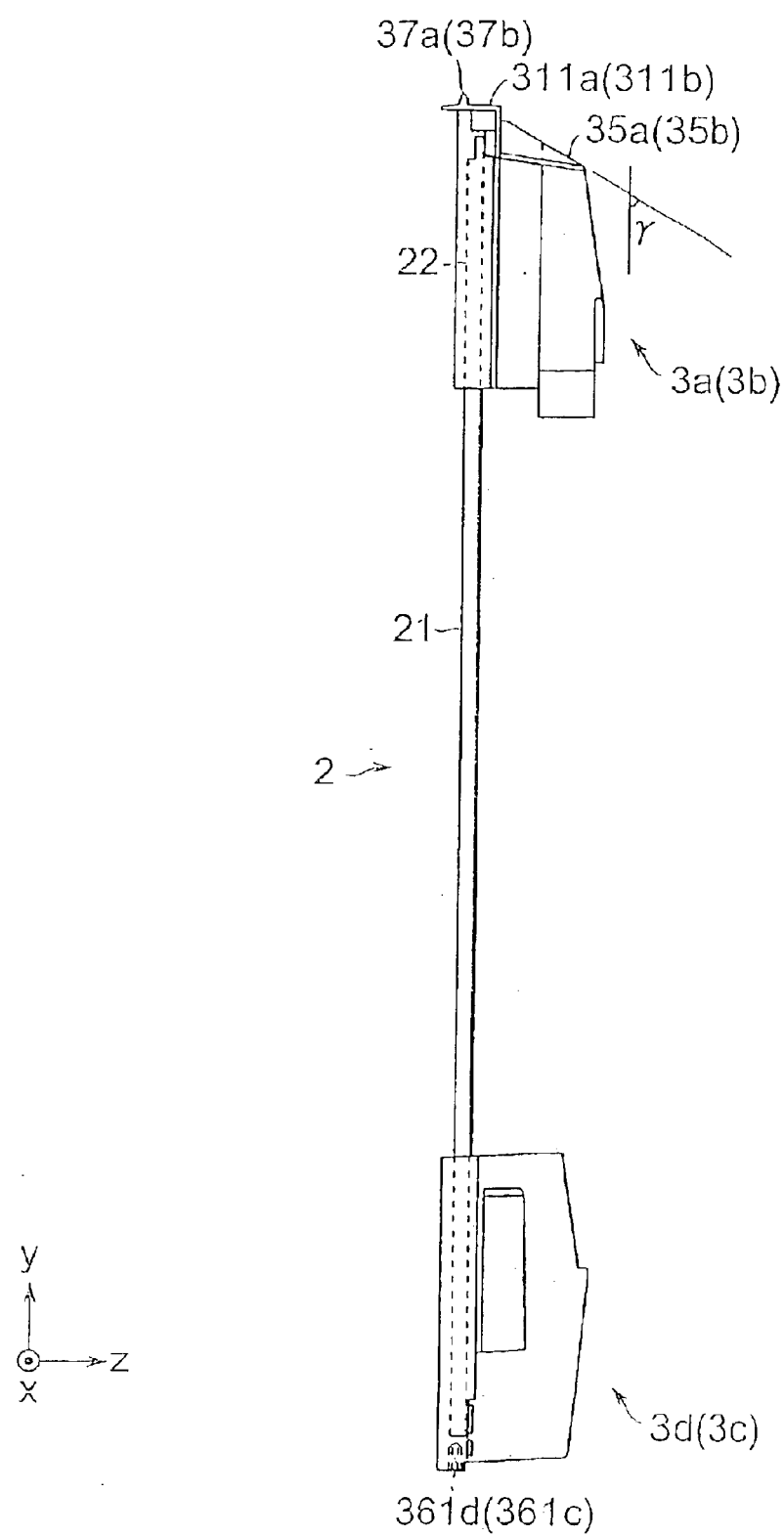
FIG. 16 is a view of the chassis 2, viewed from the side, having the brackets 3a to 3d attached.

FIG. 16 is a view of the chassis 2, viewed from the side, having the brackets 3a to 3d attached thereto. For convenience of description below, FIG. 16 shows an x-axis, y-axis, and z-axis being orthogonal to one another. Here, the y-axis is an axis parallel to the vertical direction. The z-x plane is a plane parallel to the horizontal plane. Here, to the chassis 2, presumably, the PDP 1 and the circuit board 9 are attached. In FIG. 16, once the brackets 3a and 3b are attached to the chassis 2, plates 311a and 311b are positioned in a manner as to come directly above the periphery 22. In such case, the plates 311a and 311b each protrude, at the tip each thereof, with respect to the plane 21 of the chassis 2. Also, the ribs 37a and 37b are positioned toward the front on the upper end of the chassis 2 so that a linear line parallel to the x-axis is formed. The joint members 35a and 35b are positioned on the back of the chassis 2, and rearward with respect to the periphery 22. If this is the case, as already described, the surfaces of the joint members 35a and 35b are each form the predetermined angle $\gamma$ with respect to the x-y plane. Further, the surfaces of the joint members 35a and 35b are so positioned as to be in the same plane.

Also in FIG. 16, once the brackets 3c and 3d are attached to the chassis 2, the screw holes 361c and 361d are each positioned so that each center axis thereof is parallel to the y-axis, and directly below the chassis 2.

Figure 17:
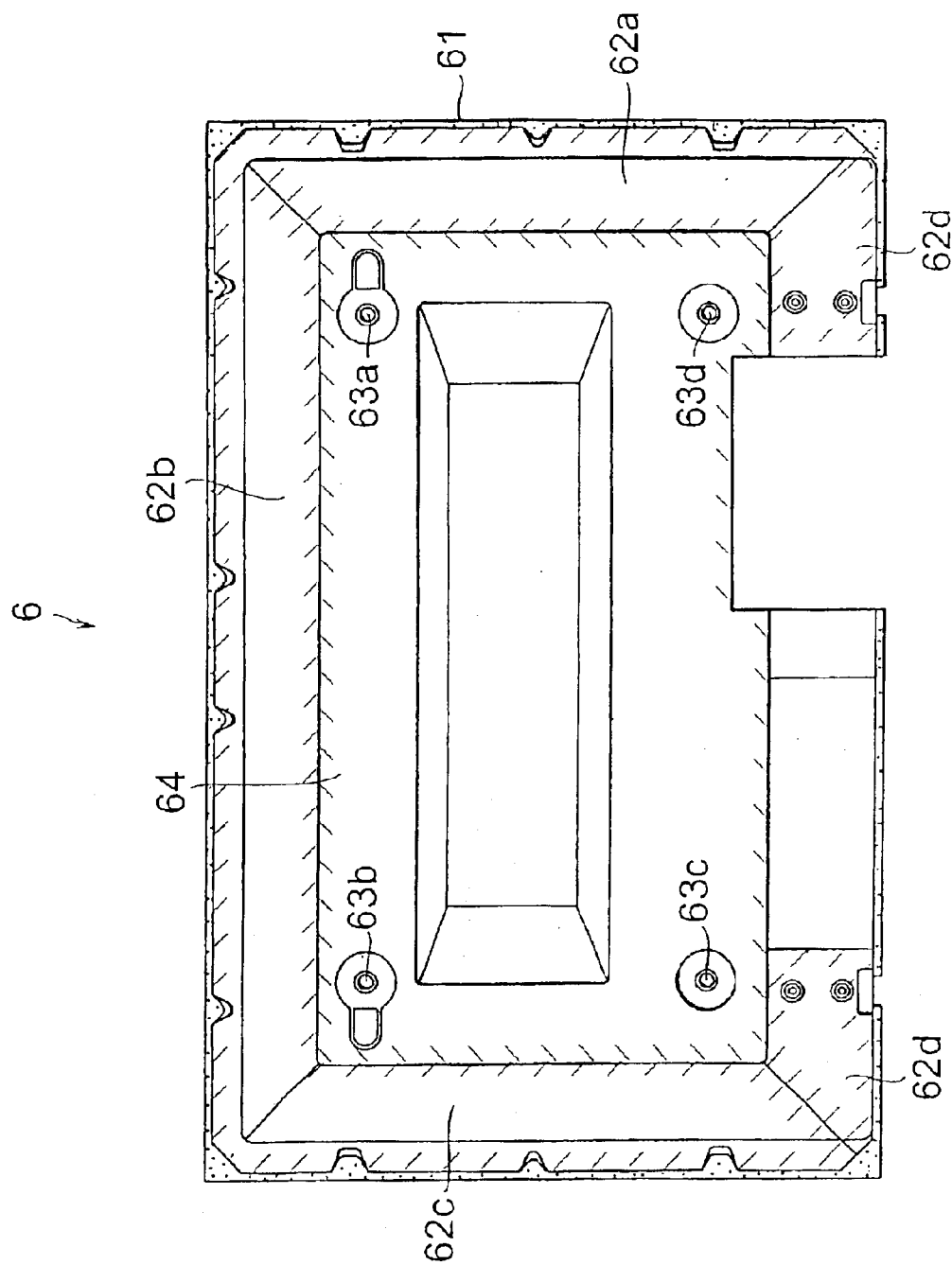
FIG. 17 is a front view of a back cover 6 of FIG. 1.

With reference to FIG. 17, described next is the back cover 6 of FIG. 1. FIG. 17 is a front view of the back cover 6. FIG. 17 is a view, in relation with FIG. 1, of the back cover 6 viewed from the direction of the arrow B of FIG. 1. In FIG. 17, the back cover 6 is made of insulation, and covers the back of the chassis 2 to which the PDP 1 has been attached (see FIG. 1). The back cover 6 includes, generally, a frame 61, four joint members 62a to 62d. and a top plate 64 wherein four through holes 63a to 63d are formed. The frame 61 is a part covered by dots in FIG. 17, and is a frame almost in rectangular. The joint members 62a to 62d are back-slashed parts. Those joint members 62a to 62d are plate-type members almost in rectangular, and each used to couple the outer frame 61 to the top plate 64. The joint members 62a to 62d are extending diagonally up. The top plate 64 is a slashed part. The top plate 64 is a plate-type member attached over an aperture formed by the joint members 62a to 62d. The through holes 63a to 63d are each formed at appropriate positions of the top plate 64 based on where the second bosses 27a to 27d are formed.

Figure 18:
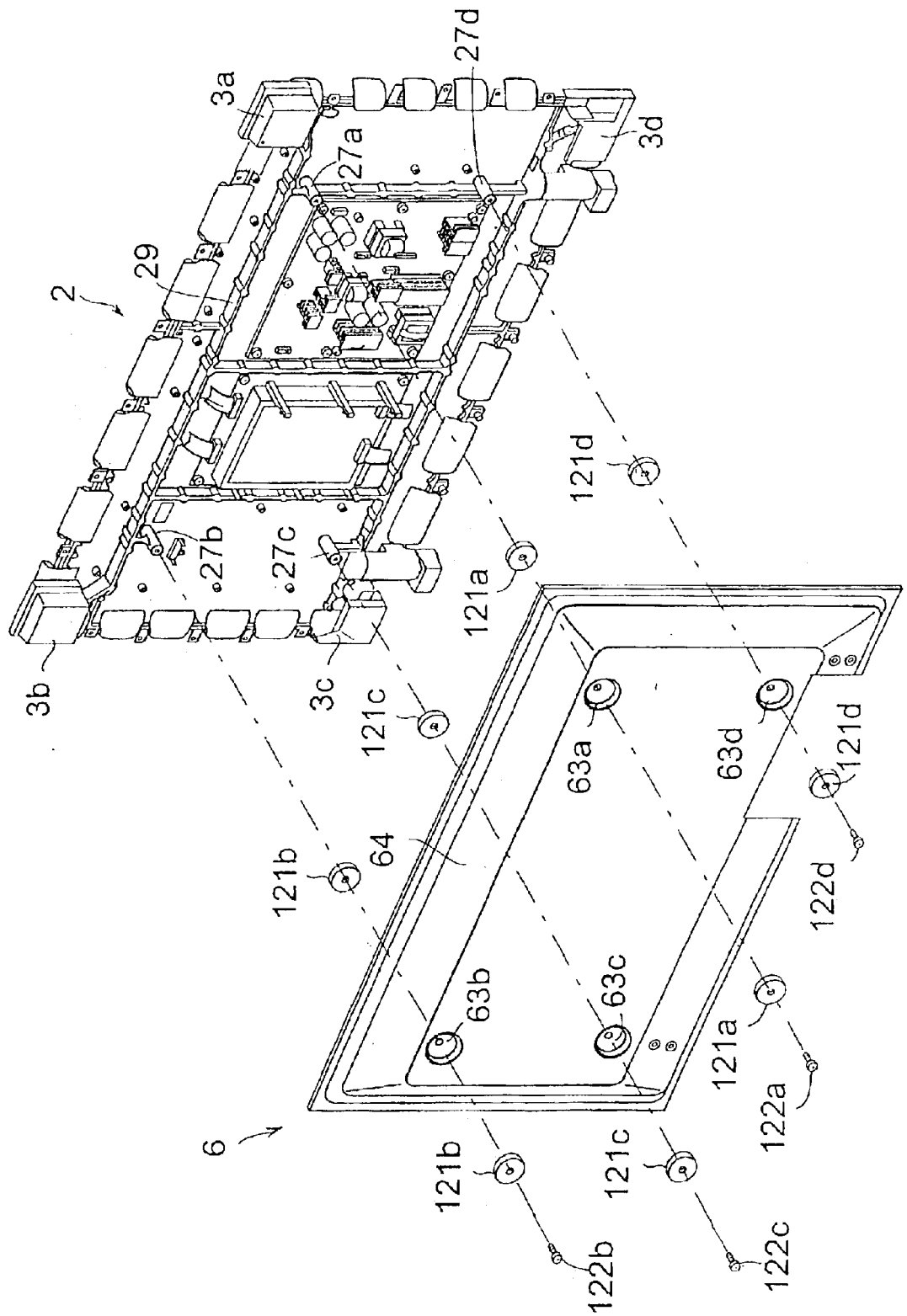
FIG. 18 is a diagram for demonstrating a manner of attaching the back cover 6 to the chassis 2.

Here, FIG. 18 is a diagram explaining a manner of attaching the back cover 6 to the chassis 2. When attaching the back cover 6, provided are a pair of spacers 121a made of insulation. In the example of FIG. 18, the spacers 121a are both shaped like a disk, and a through hole is each formed in the center parts thereof. One of the spacers 121a abuts to the surface side of the top plate 64, and the other of the spacers 121a abut to the back of the top plate 64. To be more specific, the one and the other spacers 121a are positioned so that the through holes made each in the spacers 121a positionally match to the through hole 63a. With such positioning, the through holes of the pair of spacers 121a and the through hole 63a together form a guiding hole which guides a screw 122a. Into such guiding hole, the screw 122a is first inserted, and then the screw 122a is fixed to the screw hole of the second boss 27a. In the same manner, screws 122b to 122d are fixed to the second bosses 27b to 27d, respectively, through the paired spacers 121b to 121d.

Figure 19:
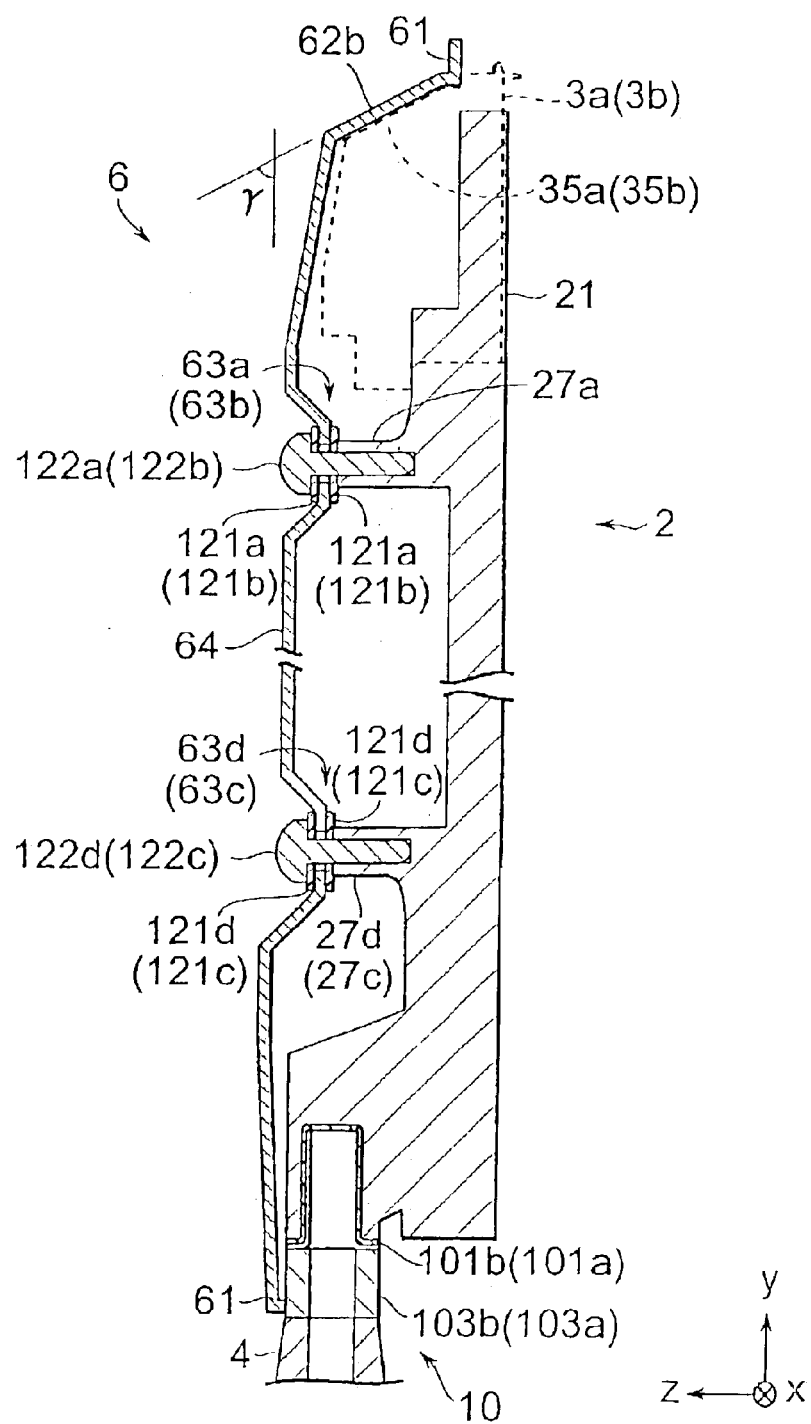
FIG. 19 is a diagram for demonstrating the electrical relationship between the back cover 6 and the chassis 2.

Referring now to FIG. 19, described is the electrical relationship between the back cover 6 and the chassis 2. FIG. 19 shows a vertical section of the unit having the back cover 6 attached to the chassis 2. For convenience of description below, FIG. 19 shows an x-axis, y-axis, and z-axis being orthogonal to one another. Here, the y-axis is an axis parallel to the vertical direction. The z-x plane is a plane parallel to the horizontal plane. In FIG. 19, due to limited space, the back cover 6 and the chassis are not entirely shown.

In FIG. 19, between the second boss 27a and the periphery of the through hole 63a, one of the spacers 12a lies. Therefore, the periphery of the through hole 63a is not directly abutting to the second boss 27a. Similarly, the other of the spacers 121a lies between the head of the screw 122a and the periphery of the through hole 63a, and thus the periphery of the through hole 63a is not directly abutting to the screw 122a. Further, the pair of the spacers 121a are made of insulation, and thus no electric continuity is established between the periphery (conductor) of the through hole 63a and the second boss 27a (conductor), also electric continuity is not established between the second boss 27a even if the screw 122a lies therebetween. Between the periphery of other through holes 63b to 63d and the second bosses 27b to 27d, electric continuity is not also established, and even if the screws 122b to 122d lie therebetween, electric continuity is not established with the second bosses 27b to 27d. Further, as for parts other than the above described through holes 63a to 63d, the back cover 6 is attached to the chassis 2 without abutting to the chassis 2. As a result, the back cover 6 is electrically insulated from the chassis 2.

FIG. 19 shows a section of a joint member 62b. The back plane of the joint member 62b is a part of a plane orthogonal to the x-y plane, and forms the predetermined angle $\gamma$ with respect to the x-y plane. This angle $\gamma$ is equal to an angle formed by the surfaces of the joint members 35a and 35b (see a dotted part) and the x-y plane. When the back cover 6 is attached to the chassis 2, the back plane of the joint member 62 abuts to the surface of the joint member 35a of the bracket 3a and the surface of the joint member 35b of the bracket 3b. Therefore, from the surfaces of the joint members 35a and 35b, an upward force acts with respect to the back plane of the joint member 62. That is, the brackets 3a and 3b support the back cover 6, while determining where to attach the back cover 6. As such, the back cover 6 is not only screwed but also supported by the brackets 3a and 3b, thereby being securely positioned.

FIG. 19 also shows a section of the positioning unit 10, which is only a part. Once the back cover 6 is attached to the chassis 2, the lower side part of the outer frame 61 abuts to the conductor blocks 103a and 103b. Therefore, electric continuity is established between the back cover 6 and the base 4, which is made of conductive materials. Note that, as already described with reference to FIGS. 8 and 9, the base 4 and the chassis 2 are insulated from each other due to the sacs 101a and 101b, and thus in this part as well, the back cover 6 is completely insulated from the chassis 2.

Next, the cabinet 7 shown in FIG. 1 is described. In FIG. 1, to form the appearance of the display device, the cabinet 7 is attached in such manner as to cover the front side of the chassis 2. In this embodiment, the cabinet 7 includes a frame 71 and a filter 72. The frame 71 is made of insulation, and shaped like a framework. To be more specific, the frame 71 is provided with a front panel 711 and four side walls 712a to 712d. The front panel 711 is substantially a rectangular plate, and in a center part thereof, an aperture for attaching the filter 72 is formed. The side walls 712a and 712c are positioned so as to be opposite to each other, and each protrude from the right side and the left side of the front panel 711 in the direction of the arrow A. Also, the side walls 712b and 712d are positioned so as to be opposite to each other, and each protrude from the upper side and the lower side of the front panel 711 in the direction of the arrow A. Further, the upper end and the lower end of the side wall 712a are connected to the right end of the side walls 712b and 712d, respectively. Also, the upper end and the lower end of the side wall 712c are connected to the left ends of the side walls 712b and 712d, respectively.

The filter 72 passes through videos displayed by the PDP 1. The filter 72 is like a plate almost in rectangular, and made of transparent material typified by glass. Such filter 72 is attached to the aperture formed in the front panel 711. At this time, the filter 71 is so attached as to form a plane parallel to both the plane of the filter 72 and the plane of the front panel 711.

Figure 20:
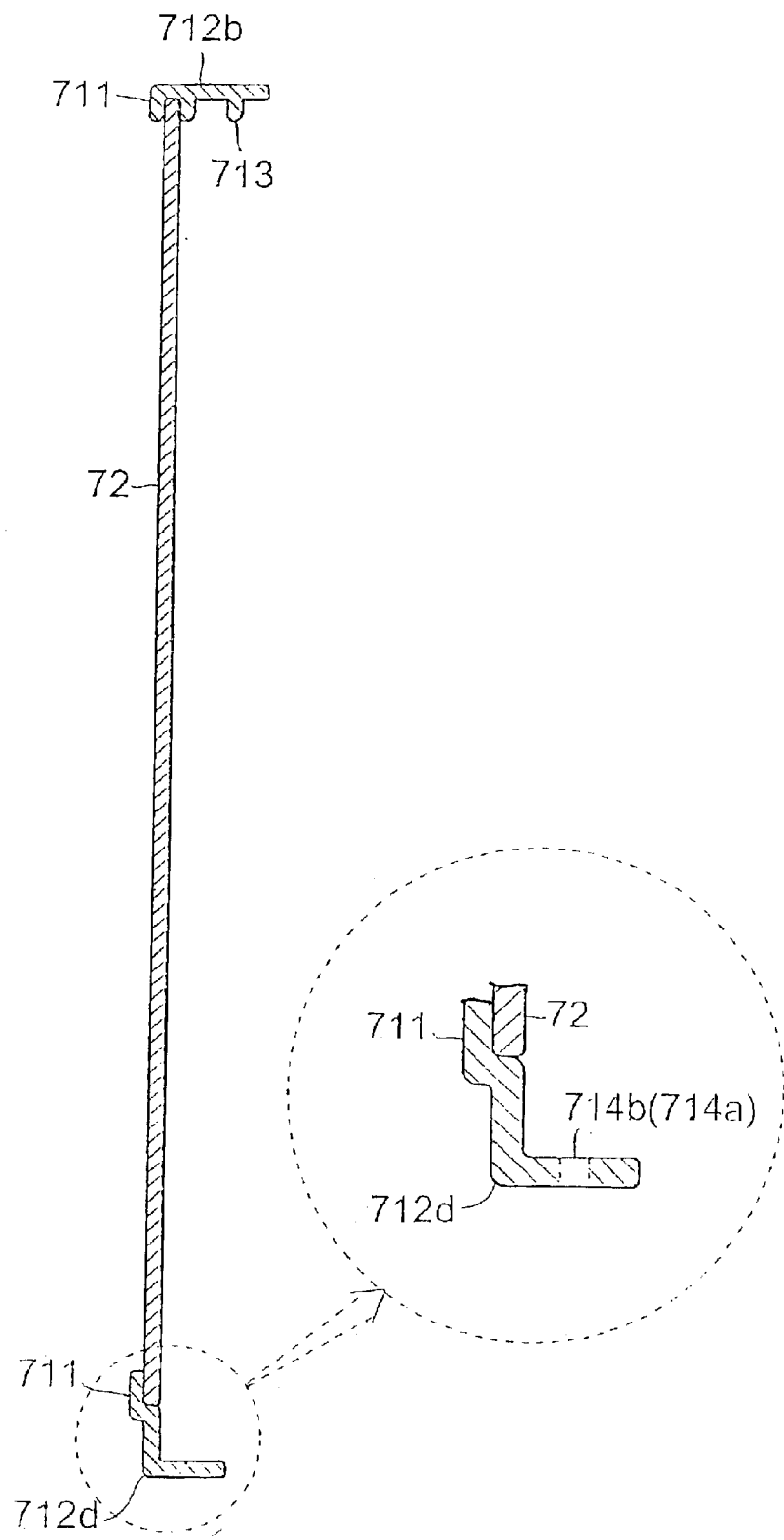
FIG. 20 is a section view of a section, taken along with a line C–C' of FIG. 1, viewed from the direction of an arrow D.

Here, FIG. 20 shows a vertical section taken along with the line C–C' shown in FIG. 1 viewed from the direction of the arrow D. In FIG. 20, a hook 713 is formed in the side wall 712b which is connected to the upper side of the front panel 711. The hook 713 is a rib protruding, from the back of the side wall 712b to downward, parallel to the front panel 711. Also, in the side wall 712d connected to the lower side of the front panel 711, an enlarged view thereof is shown in a dotted circle, two through holes 714a and 714b are formed. The positions of those through holes are related to the positions of the screw holes 361c and 361d.

Figure 21:
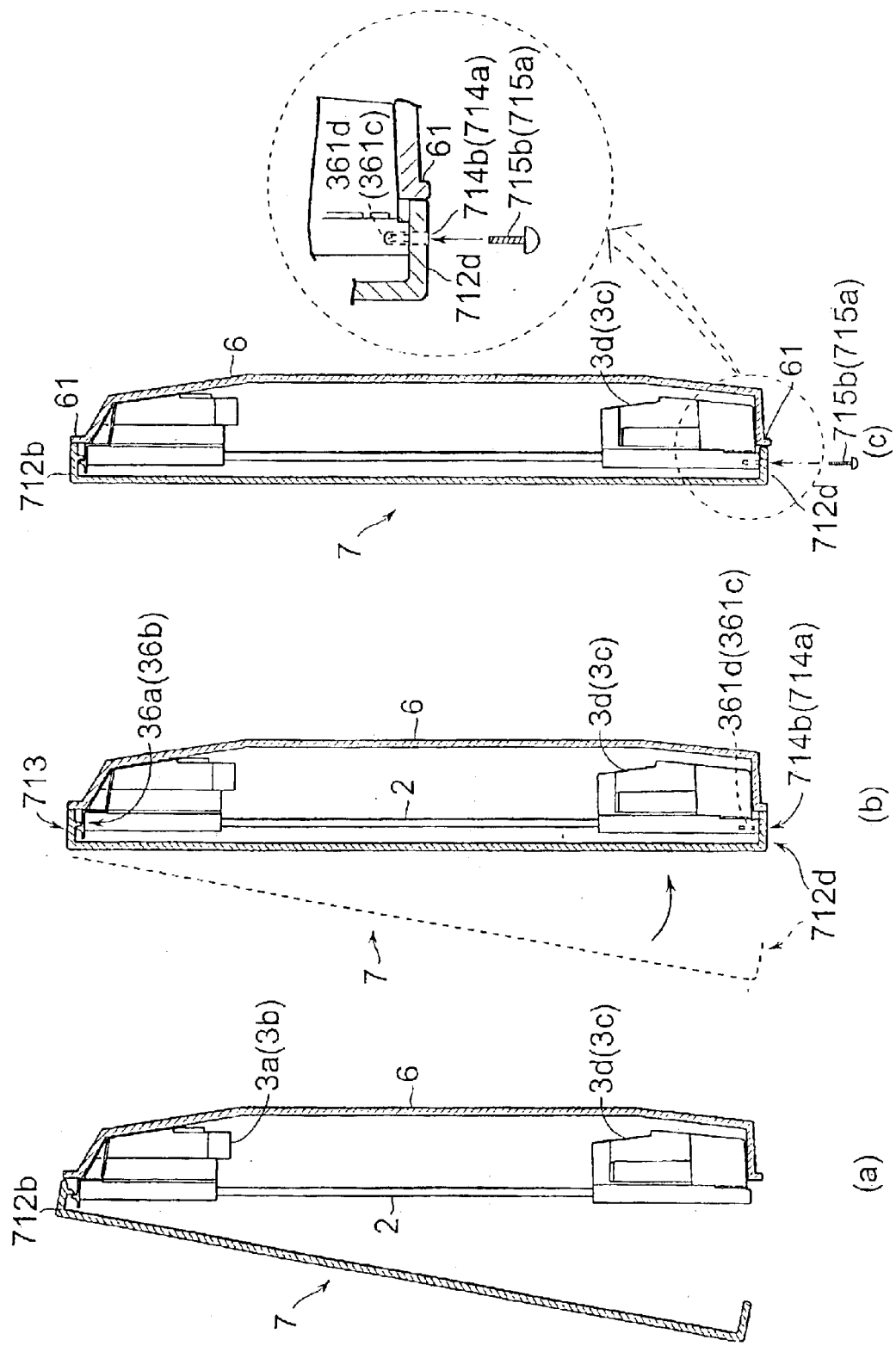
FIG. 21 is a diagram for demonstrating a manner of attaching the cabinet 7 to the chassis 2.

Described next is a manner of attaching the cabinet 7 by referring to FIG. 21. First, FIG. 21(a) shows a vertical section of the chassis 2 to which the brackets 3a to 3d and the back cover 6 have been attached. In such state as shown in FIG. 21(a), the part of the side wall 712b of the cabinet 7 is placed over the brackets 3a and 3b having fixed to the chassis 2. At this time, as shown in FIG. 21(b), the hook 713 is hooked on the ribs 36a and 36b. In this state, the inner side of the side wall 712d of the cabinet 7 is matched to come to the lower plane of the brackets 3c and 3c. At this time, the positions of the through holes 714a and 714b are matched to come to the positions of the screw holes 361c and 361d. As shown in FIG. 21(c), screws 715a and 715b are first inserted into the through holes 714a and 714b, and then fixed to the screw holes 361c and 361d. As such, the hook 713 is engaged with and stopped by the ribs 36a and 36b, and thus the cabinet 7 is fixed by screws at the part of the side wall 712d. In this manner, the cabinet 7 is supported by four brackets 3a to 3d, and also covers the front part of the chassis 2. As a result, the cabinet 7 and the back cover 6 form an exterior unit in claims, and house the PDP 1 and the circuit boards 9 fixed to the chassis 2 therein.

Here, there are two points requiring attention. A first point is that, the cabinet 7 is supported only by the brackets 3a to 3d, and does not abut to the chassis 2. That is, the cabinet 7 is fixed to the chassis 2 via the brackets 3a to 3d. Further, since the bracket 3d is made of insulation, the cabinet 7 is fixed to the chassis 2 in such state as electrically insulated therefrom.

A second point is that, when fixed to the chassis 2 via the brackets 3a to 3d, the periphery of the cabinet 7 abuts to the periphery of the back cover 6. That is, the back cover 6 and the cabinet 7 are both made of conductive materials, and thus electrical continuity is established therebetween.

As is evident from the above, the back cover 6 and the cabinet both made of conductive materials house the PDP 1 and the circuit 92 therein in such state as electrical continuity is established therebetween and is insulated from the chassis 2. Therefore, the back cover 6 and the cabinet 7 show shielding effects, and thus do not leak the EMI radiated from the PDP 1 and the circuit 92 to the outside.

With such display device, as described by referring to FIGS. 1 to 6, the PDP 1 and every circuit 92 are electrically insulated from the chassis 2 (see FIGS. 2 and 6). As a result, the circuits 92 are shielded from the PDP 1 thanks to the chassis 2. Also, the back cover 6 and the cabinet 7 house the PDP 1 and the circuits 92 therein so that shielding effects are achieved. As such, the present display device has the double shield structure. With such double shield structure, the EMI radiated from the PDP and its driving circuit is prevented from leaking to the outside of the display device, and further, the circuits 92 are prevented from erroneously operating due to the EMI from the PDP 1.

Also with such display device, the PDP 1 is attached to the plane 21 of the chassis 2 by using the adhesive sheet 8. Thereby, the PDP 1 can be fixed to the chassis 2 while the chassis 2 are kept insulated from each other.

In the chassis 2, the first boss 26 for attaching the circuit board 9, and the second boss 22 for attaching the back cover 6 are integrally formed. Therefore, attachment of the circuit boards 9 and the back cover 6 is simplified.

Here, the complete unit does not select where to be placed, receives a video signal transmitted from the outside, reproduces a reception signal, and displays a video on the screen. Here, as is well known, the sensitivity at time of receiving the video signal (radio) is preferably higher. In the above embodiment, the base 4 made of conductive materials is formed to be electrically insulated from the chassis 2, and electrical continuity is established with the back cover 6. With such structure, the reception sensitivity for the video signal can be improved. Here, the applicant has compared, by experiment, the reception sensitivity of the display device described in the present embodiment with the reception sensitivity of a display device which is not formed to be electrically insulated from the chassis 2 and electrical continuity is not established with the back cover 6. Based on the experiment result, the applicant decided to make the base 4 electrically insulated from the chassis 2, and establish electrical continuity between the base 4 and the back cover 6.

The brackets 3a to 3d are placed each at the corner of the chassis 2, which is almost in rectangular. The back cover 6 and the cabinet 7 are supported. With the brackets 3a to 3d, neither of the back cover 6 nor the cabinet 7 abuts to the chassis 2. Therefore, even if the back cover 6 and the cabinet 7 of the complete unit are externally provided with impactive forces, the provided impactive forces are absorbed by any one of the brackets 3a to 3d. Thus, the main components of the display device such as the PDP 1 and the circuit boards 9 can be protected therein.

As is obvious from the above, the base 4 supports the chassis 2 having the PDP 1 attached thereto to make it self-standing. The back cover 6 and the cabinet 7 are each attached to the brackets 3a to 3d. Consequently, only the back cover 6 is removed from the complete unit, and only the cabinet 7 is removed from the complete unit. Therefore, for example, in order to clean the inside of the filter 7, there only needs to remove the cabinet 7, and in order to change the circuit board 9, there only needs to remove the back cover 6. As such, according to the present display device, it is easy to access inside of the back cover 6 and the cabinet 7 without removing both of those.

Here, in order to achieve more satisfactory shielding effects, the periphery of the cabinet 7 (tip parts of the side walls 712a to 712d) needs to abut, completely, to the periphery of the back cover 6 (outer frame 61). In the first embodiment, however, the side walls 712a to 712d and the outer frame 61 both small in elasticity abut to one another, and thus any gap may possibly be formed between their parts where abutting. If there is any gap therebetween, the shielding effects may be weakened. Therefore, in a second embodiment, an object is to provide a display device which is capable of enhancing the shielding effects.

Figure 22:
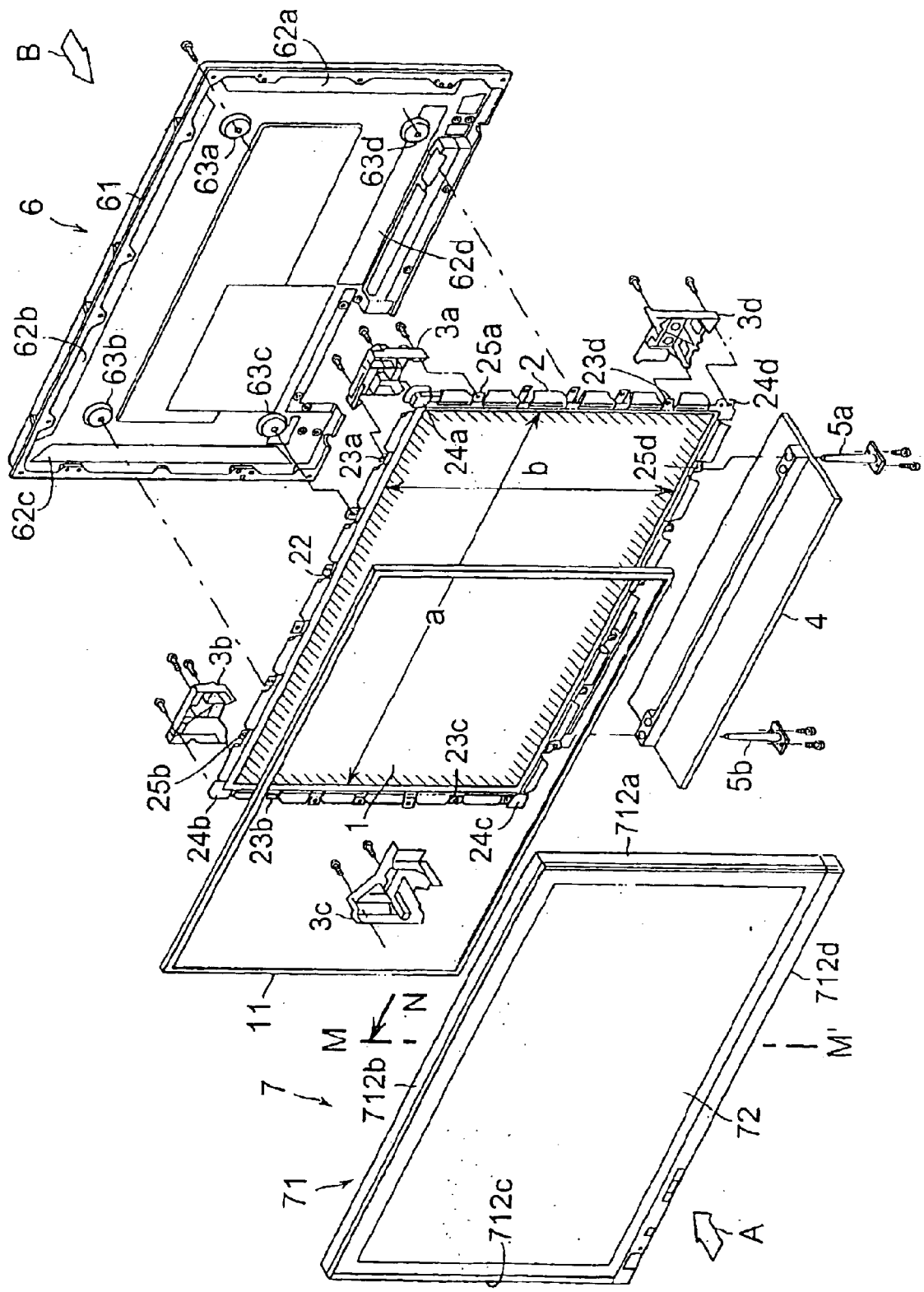
FIG. 22 is an exploded slanted view showing the entire structure of a display device according to a second embodiment of the present invention.

FIG. 22 is an exploded slanted view showing the entire structure of the display device according to the second embodiment of the present invention. The display device of FIG. 22 is different from the display device of FIG. 1 in a respect that a gasket 11 is additionally provided. Also, the side walls 712a and 712b of the cabinet 7 are slightly different in structure. These are the only differences, and thus, in FIG. 22, any constituent corresponding to that in FIGS. 1 to 18 is provided with the same reference numeral.

Figure 23:
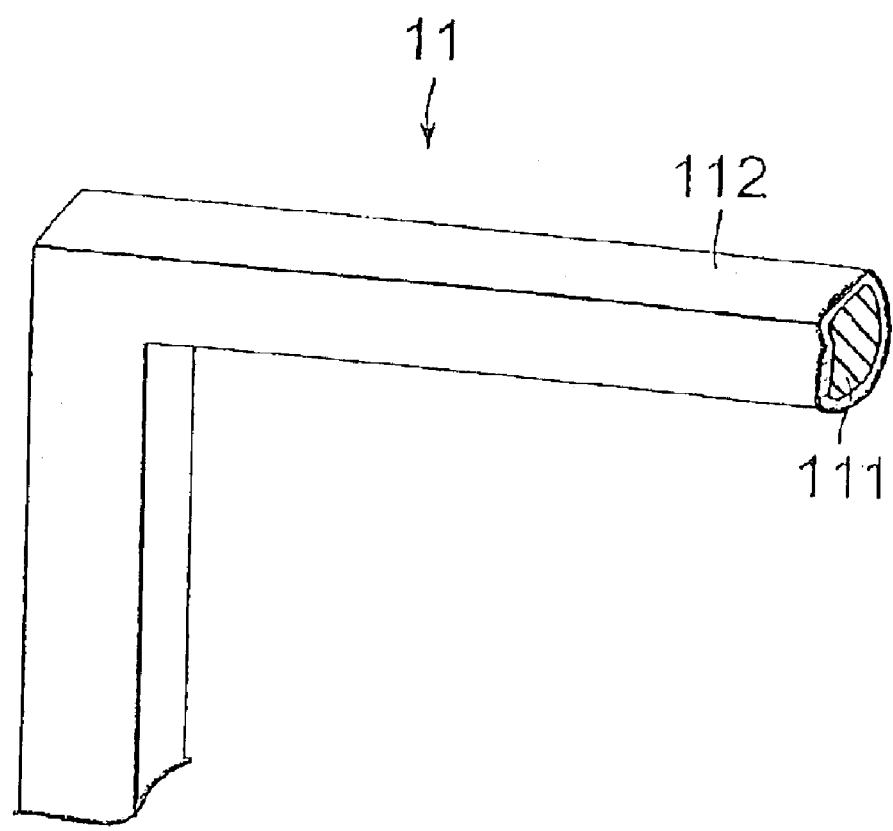
FIG. 23 is an enlarged view for demonstrating a section of a gasket of FIG. 22.

The gasket 11 is a frame almost in rectangular, and made of elastic solid having conductivity. An exemplary structure of such elastic solid having conductivity, as shown in FIG. 23, is the one obtained by covering an elastic solid 111 (see a back-slashed part) typified by rubber with a cloth 112 (see a slashed part) having conductive materials plated thereon.

Figure 24:
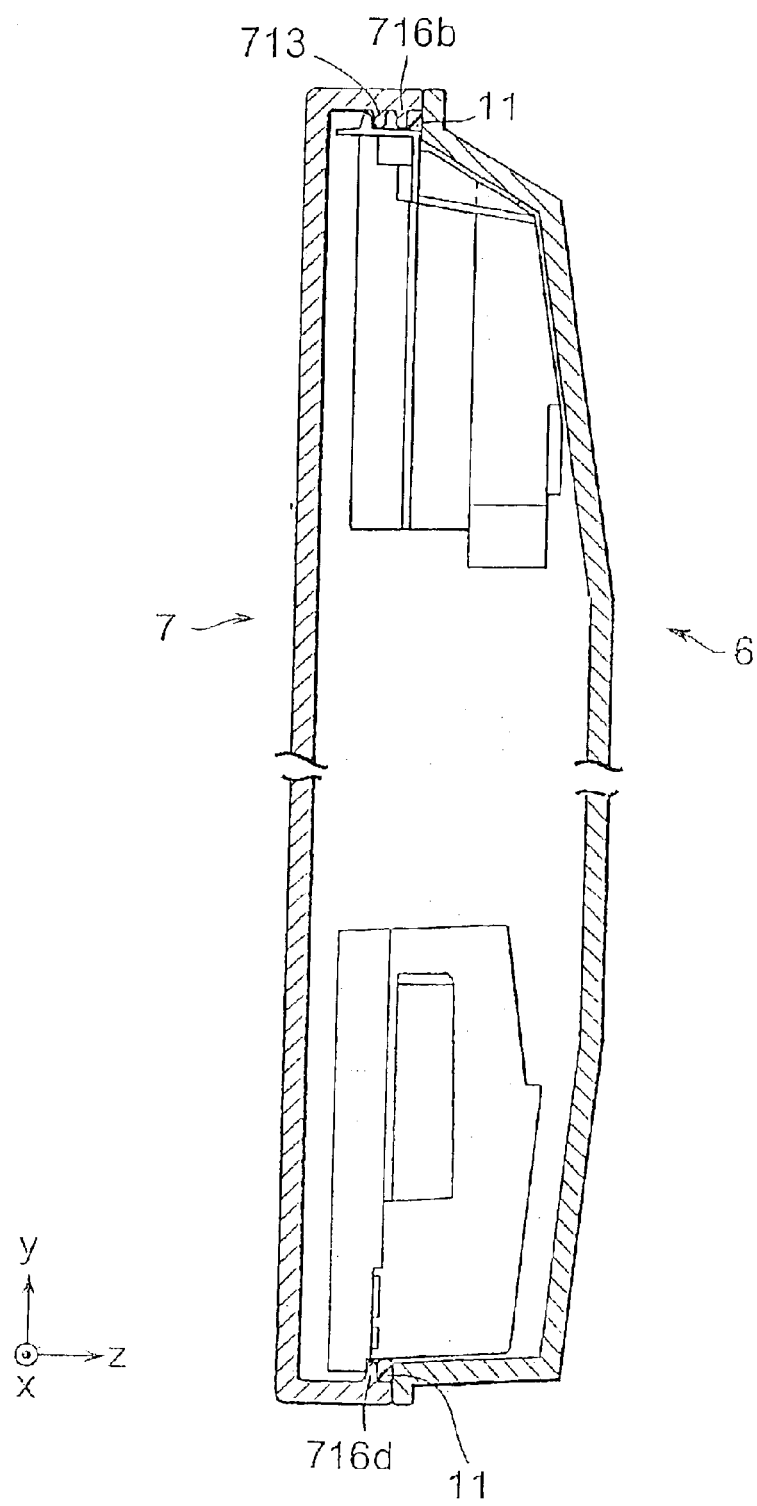
FIG. 24 is a section view for demonstrating the inside of the cabinet 7 of FIG. 22.
Figure 25:
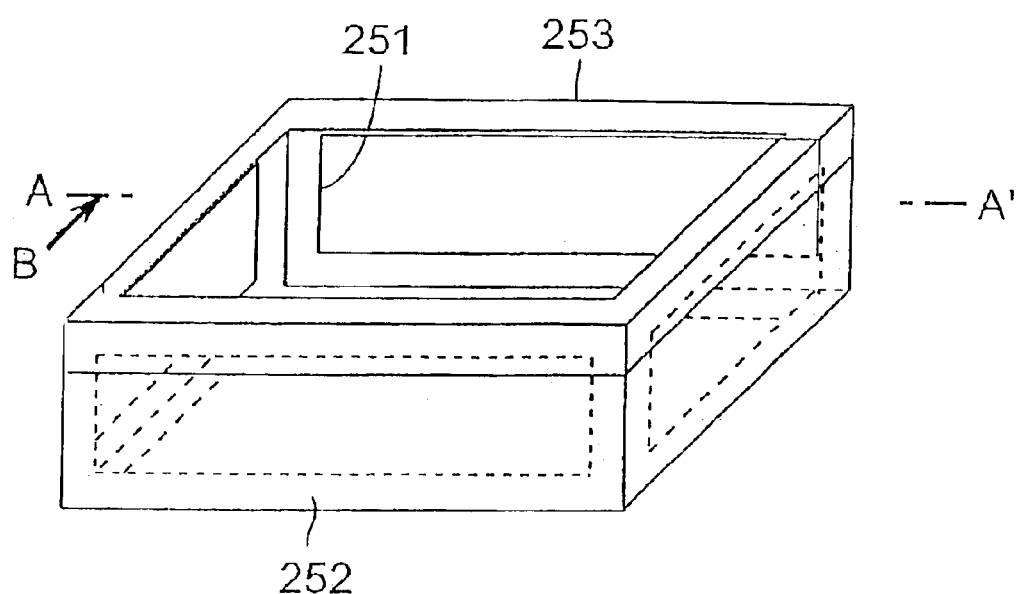
FIG. 25 is a diagram demonstrating the structure of the main body applied to a conventional display device.
Figure 25:
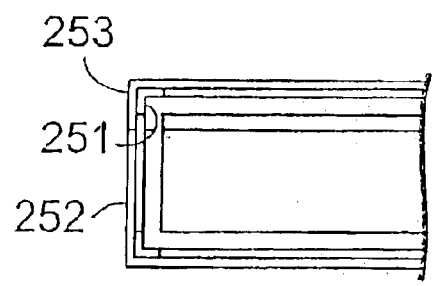

FIG. 24 is a section view showing the inside of the cabinet 7. In FIG. 24, due to limited space, the cabinet 7, and the like, are not entirely shown. Also, for convenience of description below, FIG. 24 shows an x-axis, y-axis, and z-axis being orthogonal to one another. Here, the y-axis is an axis parallel to the vertical direction. The z-x plane is a plane parallel to the horizontal plane. In FIG. 24, in the side walls 712b and 712d, stoppers 716a and 716b are formed. The stopper 716b and 716d are ribs protruding substantially vertical from the inside of the side walls 712b and 712d. The stoppers 716b and 716d are, preferably, formed from one end of the stoppers 716b and 716d, respectively, to the other end thereof to be parallel to the x axis. Similarly, in the side walls 712a and 712c, ribs similar to the stopper 716b are formed. Next below, the ribs formed in the side walls 712a and 712c are referred to as stoppers 716a and 716c. With such stoppers 712a to 712d, a ring-like rib is formed, entirely, inside of the cabinet 7.

The gasket 11 is adhered to the inside, entirely, of the cabinet 7 so that the side walls 712a to 712d abut to the stoppers 716a to 716d. Therefore, once the back cover 6 and the cabinet 7 are attached to the chassis 2, the side walls 712a to 712d touch to the outer frame 61 through the gasket 11. Thus, the gasket 11 is pushed towards the back cover 6 by the cabinet 7, and further, pushed towards the cabinet 7 by the back cover 6. As is an elastic solid, the gasket 11 closely attached to the back cover 6 and the cabinet 7. In other words, the gasket 11, the back cover 6, and the cabinet 7 are touched to one another rather close. Also, as the gasket 11 is conductive, electrical continuity is well established between the back cover 6 and the cabinet 7.

As described in the foregoing, according to the display device of the second embodiment, between the back cover 6 and the cabinet 7 lies an elastic body having conductivity. Therefore, the back cover 6, the cabinet 7, and the gasket 11 are completely attached to one another, and thus the shielding effects becomes more satisfactory between the back cover 6 and the cabinet 7.

Here, in the above embodiments, the back cover 6 is described as made of conductive materials. However, the back cover 6 may be provided with conductivity by adhering a metallic or aluminum foil to inside of the back cover 6 made of resin.

Further, the display device may be so structured as to be a wall-hung type.

INDUSTRIAL APPLICABILITY

The present invention is applied to a display device which displays videos on a screen thereof, and especially, to a display device having an external unit structured by a back cover, cabinet, and the like, which houses a PDP (Plasma Display Panel) and its driving circuit therein so that any unwanted radiation noise is prevented from leaking to the outside, for example, to a television receiver.

What is claimed is:

1. A display device for displaying a video on a screen thereof, comprising:

a plasma display panel (hereinafter, referred to as PDP (Plasma Display Panel)) structuring said screen;

a circuit board on which a circuit for driving said PDP is arranged;

a chassis made of a conductive material having one surface thereof attached with said PDP, and having the other surface thereof attached with said circuit board;

an exterior unit including a conductive cabinet for covering a front side of said chassis and a conductive back cover for covering a back side of said chassis, and housing said PDP and said circuit board having attached to said chassis; and an insulative bracket fixed to said chassis and for supporting said cabinet and said back cover, wherein said cabinet and said back cover are abutted to each other, and are electrically insulated from said chassis, and said chassis is electrically insulated from the circuit arranged on the circuit board.

* * * * *